(12) United States Patent
Yamamoto et al.

(10) Patent No.: US 8,436,604 B2
(45) Date of Patent: May 7, 2013

(54) MEASURING APPARATUS, PARALLEL MEASURING APPARATUS, TESTING APPARATUS AND ELECTRONIC DEVICE

(75) Inventors: Kazuhiro Yamamoto, Saitama (JP); Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 287 days.

(21) Appl. No.: 12/853,851

(22) Filed: Aug. 10, 2010

(65) Prior Publication Data

US 2011/0121815 A1      May 26, 2011

Related U.S. Application Data

(63) Continuation of application No. PCT/JP2009/001306, filed on Mar. 24, 2009.

(30) Foreign Application Priority Data

Mar. 27, 2008   (JP) .................................. 2008-083509

(51) Int. Cl.
*G01R 25/00*   (2006.01)

(52) U.S. Cl.
USPC .................. 324/76.77; 324/76.52; 324/76.53; 324/76.54

(58) Field of Classification Search .... 324/76.52–76.54, 324/76.77
See application file for complete search history.

(56) References Cited

U.S. PATENT DOCUMENTS

| | | | |
|---|---|---|---|
| 4,164,648 A | | 8/1979 | Chu |
| 5,923,676 A | * | 7/1999 | Sunter et al. .................. 714/733 |
| 6,130,566 A | * | 10/2000 | Yokomizo ..................... 327/175 |
| 6,670,800 B2 | * | 12/2003 | Beach et al. ............... 324/76.16 |
| 7,378,833 B2 | * | 5/2008 | Wagner ..................... 324/76.54 |
| 8,085,104 B2 | * | 12/2011 | Lin et al. ........................ 331/173 |
| 2002/0180540 A1 | | 12/2002 | Hirai |
| 2003/0006750 A1 | | 1/2003 | Roberts et al. |

(Continued)

FOREIGN PATENT DOCUMENTS

| | | |
|---|---|---|
| CN | 1656384 A | 8/2005 |
| JP | S64-79687 A | 3/1989 |

(Continued)

OTHER PUBLICATIONS

Written Opinion (PCT/ISA/237) issued in PCT/JP2009/001306 (parent application) mailed in Jun. 2009.

(Continued)

*Primary Examiner* — Huy Q Phan
*Assistant Examiner* — Thang Le

(57) ABSTRACT

Provided is a measurement apparatus that measures a signal under measurement, comprising a first oscillation circuit that receives one pulse of the signal under measurement and begins oscillating according to the pulse of the signal under measurement to output a first oscillated signal; a second oscillation circuit that receives one pulse of a reference signal and begins oscillating according to the pulse of the reference signal to output a second oscillated signal having a period that is different from a period of the first oscillated signal; and a first sampling section that samples the first oscillated signal according to a pulse of the second oscillated signal. The first oscillation circuit and the second oscillation circuit each include a control section that selects one pulse; a delay section that delays the pulse; and a loop line that feeds the pulse back to an input terminal of the delay section.

28 Claims, 24 Drawing Sheets

U.S. PATENT DOCUMENTS

| | | |
|---|---|---|
| 2004/0041606 A1 | 3/2004 | Kirsch |
| 2006/0036411 A1 | 2/2006 | Nagai |
| 2008/0203998 A1* | 8/2008 | Jenkins .................. 324/76.41 |

FOREIGN PATENT DOCUMENTS

| | | |
|---|---|---|
| JP | 2004-325332 A | 11/2004 |
| JP | 2005-521059 A | 7/2005 |
| TW | 574785 B | 2/2004 |
| TW | 200614240 A | 5/2006 |
| TW | I260861 B | 8/2006 |
| TW | 200746624 A | 12/2007 |

OTHER PUBLICATIONS

Chu et al., "Universal Counter Resolves Picoseconds in Time Interval Measurements," Hewlett-Packard Journal, Aug. 1978, vol. 29, No. 12, pp. 2-11 downloaded from http://www.hpl.hp.com/hpjournal/pdfs/issuePDFs/1978-08.pdf.

International Search Report (ISR) issued in PCT/JP2009/001306 (parent application) mailed in Jun. 2009.

JP Office Action/Search Report and Machine Translation Dated Sep. 25, 2012; Application No. 2010-505341.

Taiwanese Office Action dated Aug. 22, 2012, in a counterpart Taiwanese patent application No. 098109984.

* cited by examiner

MEASURING APPARATUS, PARALLEL MEASURING APPARATUS, TESTING APPARATUS AND ELECTRONIC DEVICE

BACKGROUND

1. Technical Field

The present invention relates to a measurement apparatus, a parallel measurement apparatus, a test apparatus, and an electronic device.

2. Related Art

A known apparatus for sampling a signal under measurement according to a prescribed sampling signal operates by delaying the sampling signal with delay elements having different delay amounts to generate a plurality of strobe timings, as described in Patent Document 1, for example. In this case, by inputting the signal under measurement and different strobe timings into comparison circuits arranged in parallel, the signal under measurement can be sampled with a resolution corresponding to the delay amounts of the delay elements.

Patent Document 1: Japanese Patent Application Publication No. 2004-325332

In the above apparatus, however, a number of comparison circuits and delay elements corresponding to the resolution and the measurement range are provided. In other words, when performing measurement with a higher resolution over a wider measurement range, a larger number of comparison circuits and delay elements are provided. Therefore, when the size and power consumption of circuits are important, an apparatus with smaller circuits and lower power consumption is preferable.

Furthermore, in the above apparatus, the delay amounts of the delay elements correspond to the measurement resolution. Therefore, an apparatus is desired that can perform measurement with a higher resolution when measuring the signal under measurement with units of resolution that are less than the smallest delay time of the delay elements.

In the above apparatus, variation in the delay amounts of the delay elements affects the measurement accuracy. Therefore, an apparatus is desired that can perform highly accurate measurement when the delay amount variation among the delay elements is too large to be ignored.

In the above apparatus, in order for the delay elements to generate the prescribed delay amounts, it is necessary to detect in advance the setting values to be set in the delay elements to achieve the prescribed delay amounts. In this case, the delay amounts obtained for certain setting values can be measured by forming a loop that feeds the output of a delay element set with the prescribed setting values back to the input terminal of the delay element, and measuring the period of the loop oscillation. Then, by sequentially changing the setting values, the delay amount for each setting value can be measured. However, it is difficult for the measurement of the delay amount corresponding to each setting value to be performed simultaneously, and so measurement errors occur when there are power supply voltage variations or temperature variations between measurements for different setting values. Therefore, an apparatus with decreased measurement error is desired when the measurement error is too large to be ignored.

SUMMARY

Therefore, it is an object of an aspect of the innovations herein to provide a measurement apparatus, a parallel measurement apparatus, a test apparatus, and an electronic device, which are capable of overcoming the above drawbacks accompanying the related art. The above and other objects can be achieved by combinations described in the independent claims. The dependent claims define further advantageous and exemplary combinations of the innovations herein.

According to an aspect of the present invention, provided is a measurement apparatus that measures a signal under measurement, comprising a first oscillation circuit that receives one pulse of the signal under measurement and begins oscillating according to the pulse of the signal under measurement to output a first oscillated signal; a second oscillation circuit that receives one pulse of a reference signal and begins oscillating according to the pulse of the reference signal to output a second oscillated signal having a period that is different from a period of the first oscillated signal; and a first sampling section that samples the first oscillated signal according to a pulse of the second oscillated signal. Also provided is a test apparatus including this measurement apparatus and a judging section.

According to another aspect of the present invention, provided is a parallel measurement apparatus that measures a signal under measurement, comprising three of the measurement apparatuses according to the first aspect that are arranged in parallel and that each receive a reference signal or the signal under measurement with a different phase; three offset addition sections that are provided to correspond one-to-one with the measurement apparatuses and that each subtract an offset value corresponding to the phase of the received reference signal or signal under measurement from a phase of the signal under measurement measured by the corresponding measurement apparatus; and a median value selection circuit that selects a median value, from among values output by the offset addition sections, to be the phase of the signal under measurement. Also provided is an electronic device including and a test apparatus that each include this parallel measurement apparatus.

According to another aspect of the present invention, provided is an electronic device comprising an operational circuit that outputs a signal under measurement; and a measurement apparatus that measures the signal under measurement. The measurement apparatus includes a first oscillation circuit that receives one pulse of the signal under measurement and begins oscillating according to the pulse of the signal under measurement to output a first oscillated signal; a second oscillation circuit that receives one pulse of a reference signal and begins oscillating according to the pulse of the reference signal to output a second oscillated signal having a period that is different from a period of the first oscillated signal; and a first sampling section that samples the first oscillated signal according to a pulse of the second oscillated signal.

According to another aspect of the present invention, provided is a measurement apparatus that measures a signal under measurement and that comprises a plurality of oscillation circuit units connected in cascade. Each oscillation circuit unit includes a first oscillation circuit that begins oscillating according to a pulse input thereto to output a first oscillated signal; a second oscillation circuit that begins oscillating according to a pulse input thereto to output a second oscillated signal having a period that is different from a period of the first oscillated signal; and a sampling section that samples the first oscillated signal according to a pulse of the second oscillated signal. Furthermore, the first oscillation circuit of the oscillation circuit unit at a first stage receives one pulse of the signal under measurement, the first oscillation circuit of the oscillation circuit unit at the first stage receives one pulse of a reference signal, the first oscillation circuits of the oscillation circuit units at stages other than the first stage each receive one pulse of the first oscillated signal output by the oscillation circuit of the previous stage, and the second oscillation circuits of the oscillation circuit units at stages other than the first stage each receive one pulse of the second oscillated signal output by the oscillation circuit of the previous stage.

According to another aspect of the present invention, provided is a measurement apparatus that measures a signal under measurement and that comprises a plurality of oscillation circuit units in parallel. Each oscillation circuit unit includes a first oscillation circuit that begins oscillating according to a pulse of the signal under measurement input thereto to output a first oscillated signal; a second oscillation circuit that begins oscillating according to a pulse of a reference signal input thereto to output a second oscillated signal having a period that is different from a period of the first oscillated signal; and a sampling section that samples the first oscillated signal according to a pulse of the second oscillated signal. Furthermore, the first oscillation circuits of the oscillation circuit units each receive different pulses of the signal under measurement, and the second oscillation circuits of the oscillation circuit units each receive a pulse, from among the pulses of the reference signal, that corresponds to a pulse of the signal under measurement input to the corresponding first oscillation circuit.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
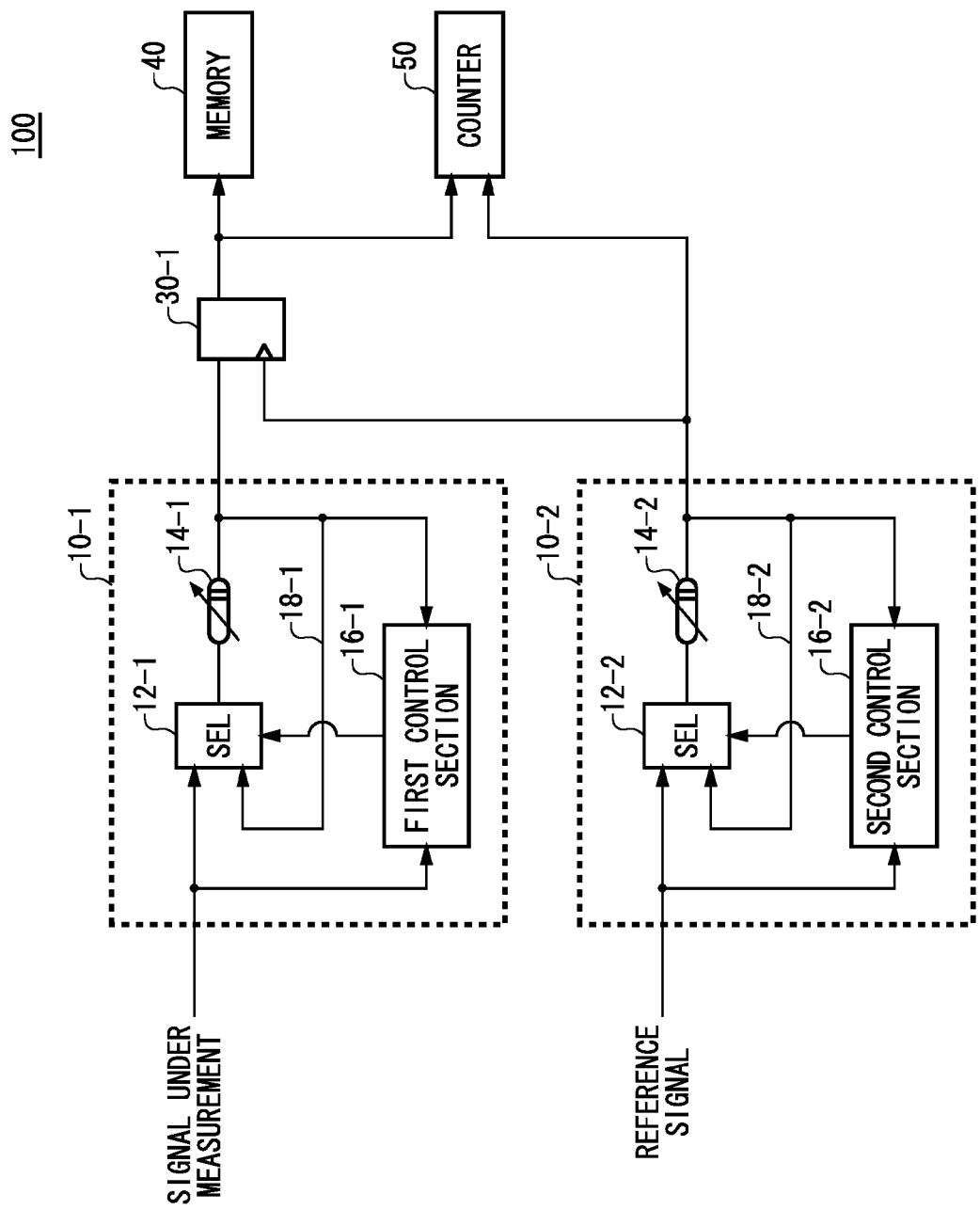
FIG. 1 shows an exemplary configuration of a measurement apparatus 100 according to an embodiment of the present invention.

FIG. 1 shows an exemplary configuration of a measurement apparatus 100 according to an embodiment of the present invention. The measurement apparatus 100 measures a signal under measurement, and includes a first oscillation circuit 10-1, a second oscillation circuit 10-2, and a first sampling section 30-1. The measurement apparatus 100 may also include a memory 40 and a counter 50.

The first oscillation circuit 10-1 receives a single pulse of the signal under measurement. For example, the first oscillation circuit 10-1 may receive a pulse of an edge timing to be measured in the signal under measurement. The measurement apparatus 100 may further include a pulse selecting section that selects the pulse to be input to the first oscillation circuit 10-1. The first oscillation circuit 10-1 begins oscillating according to the pulse to output a first oscillated signal.

The second oscillation circuit 10-2 receives a single pulse of a reference signal. The reference signal indicates a timing at which the signal under measurement is to be sampled. The measurement apparatus 100 may further include a reference signal generating section to generate the reference signal. The reference signal generating section may generate a single pulse as the reference signal. In this case, the pulse selecting section may select the pulse of the signal under measurement near a timing of the pulse of the reference signal.

The reference signal generating section may generate a periodic signal as the reference signal. In this case, the measurement apparatus 100 may further include a second pulse selecting section that selects a pulse of the reference signal and inputs the selected pulse to the second oscillation circuit 10-2. The second pulse selecting section may select the pulse of the reference signal near a timing of the pulse of the signal under measurement selected by the first pulse selecting section. Instead, when the device under test outputs the signal under measurement and a clock signal synchronized with the signal under measurement, the clock signal may be input to the second oscillation circuit 10-2 as the reference signal. In this case, the second pulse selecting section selects a single pulse of the clock signal to input to the second oscillation circuit 10-2. The second oscillation circuit 10-2 begins oscillating in response to the input pulse to output a second oscillated signal having a different period than the first oscillated signal.

The first oscillation circuit 10-1 and the second oscillation circuit 10-2 may have the same circuit configuration. The first oscillation circuit 10-1 includes a first selector 12-1, a first delay section 14-1, a first control section 16-1, and a first loop line 18-1. The second oscillation circuit 10-2 includes a second selector 12-2, a second delay section 14-2, a second control section 16-2, and a second loop line 18-2.

The first selector 12-1 has a first input terminal and a second input terminal. The signal under measurement is input to the first input terminal and the output signal of the first delay section 14-1 is input to the second input terminal via the first loop line 18-1. The first selector 12-1 passes one of the signals input to the first input terminal and the second input terminal. The first selector 12-1 may further function as the first pulse selecting section described above to select a single pulse of the input signal under measurement.

The first delay section 14-1 delays the signal passed by the first selector 12-1 by a predetermined first delay amount, and outputs this delayed signal as the first oscillated signal. The signal output by the first delay section 14-1 branches through the first loop line 18-1 to be input to the second input terminal of the first selector 12-1.

The first control section 16-1 controls the first selector 12-1 to pass one of the signals input to the first input terminal and the second input terminal. For example, the first control section 16-1 may cause the first selector 12-1 to pass one pulse to be measured of the signal under measurement. In this case, the first control section 16-1 causes the first selector 12-1 to select the first input terminal at a timing of the one pulse to be measured, based on the signal under measurement. Then, after the pulse is passed from the first input terminal of the first selector 12-1, the input being passed by the first selector 12-1 is switched from the first input terminal to the second input terminal. When the first selector 12-1 selects the second input terminal, the signal output by the first delay section 14-1 is fed back as input to the first delay section 14-1, which generates the first oscillated signal with a period according to the first delay amount of the first delay section 14-1. As a result of this control, the oscillation can begin in response to a single pulse, without being affected by subsequent pulses of the signal under measurement.

The second selector 12-2, the second delay section 14-2, the second control section 16-2, and the second loop line 18-2 respectively adopt substantially the same function and configuration as the first selector 12-1, the first delay section 14-1, the first control section 16-1, and the first loop line 18-1. However, it should be noted that the second selector 12-2 receives the reference signal at the first input terminal thereof. The second selector 12-2 may function as the second pulse selecting section described above to select a single pulse of the input reference signal.

The second delay section 14-2 delays the signal received from the second selector 12-2 by a second delay amount that is different from the first delay amount of the first delay section 14-1, and outputs the delayed signal. The second control section 16-2 can generate a second oscillated signal according to a single pulse of the reference signal under the control of the second selector 12-2, in the same manner as the first delay section 14-1 described above. It should be noted that, since the second oscillated signal has a period corresponding to the second delay amount, which is different from the first delay amount, the first oscillated signal and the second oscillated signal have different periods. In other words, in each cycle of the first oscillated signal and the second oscillated signal, the relative phases of the first oscillated signal and the second oscillated signal gradually change. The amount of change in the relative phases in a single cycle is determined by the difference between the first delay amount and the second delay amount. For example, if the delay amounts of the first loop line 18-1 and the second loop line 18-2 are equal, the amount of change in the relative phases in a single cycle is substantially equal to the difference between the first delay amount and the second delay amount.

The first sampling section 30-1 samples the first oscillated signal according to the pulse of the second oscillated signal. For example, the first sampling section 30-1 may detect the logic value of the first oscillated signal at a timing of the pulse of the second oscillated signal. In this case, the first sampling section 30-1 may be a flip-flop that receives the first oscillated signal as the data input and receives the second oscillated signal as the clock input. Since the relative phases of the first oscillated signal and the second oscillated signal change by an amount substantially equal to the difference between the first delay amount and the second delay amount for each oscillation cycle of the second oscillation circuit 10-2, in the manner described above, the first sampling section 30-1 can sample the prescribed pulse of the signal under measurement with a resolution substantially equal to the difference between the first delay amount and the second delay amount.

With this configuration, the signal under measurement can be sampled with a high resolution and over a wide range, without using a large number of delay elements and comparison circuits. Therefore, the circuit size of the measurement apparatus 100 can be decreased. Furthermore, since the signal under measurement is sampled with a resolution substantially equal to the difference between the delay amounts of the first delay section 14-1 and the second delay section 14-2, the signal under measurement can be sampled with a resolution of unit intervals that are less than the minimum delay time of the delay elements used in the first delay section 14-1 and the second delay section 14-2.

The phase of the pulses of the second oscillated signal gradually change relative to the pulses of the first oscillated signal, i.e. the delay time changes. Therefore, different relative phases of the second oscillated signal relative to the first oscillated signal, i.e. different delay times, can be generated according to the number of loops through the oscillation circuits. In other words, the different relative phases of the second oscillated signal, i.e. the different delay times, are generated by looping the pulse through the same delay circuit. Furthermore, the sampling at the different relative phases, i.e. different delay times, is performed by the same circuit, i.e. the first sampling section 30-1. Therefore, variation in the delay times between delay elements is lower than in a case where a plurality of delay elements are used, a plurality of sampling timings are generated by each delay element, and sampling is performed by sampling sections provided to correspond to the delay elements.

The memory 40 stores the sampling results from the first sampling section 30-1. For example, the memory 40 may store the logic values output by the first sampling section 30-1 in a time sequence. Using the sampling results stored in the memory 40, the edge timing of the pulse of the signal under measurement can be detected from the data number at which the logic value transitions. For example, the relative phase of the signal under measurement with respect to the reference signal can be detected based on the number of oscillations, i.e. the number of samples, from when the first oscillation circuit 10-1 and the second oscillation circuit 10-2 begin oscillating to when the logic value of the sampling result transitions.

The counter 50 detect the timing at which the logic value output by the first sampling section 30-1 transitions. For example, the counter 50 may count the number of oscillations, i.e. the number of pulses, of the second oscillated signal from when the second oscillation circuit 10-2 begins outputting second oscillated signal to when the logic value output by the first sampling section 30-1 transitions. The time difference between the signal under measurement and the reference signal can be calculated by multiplying the count value of the counter 50 by the measurement resolution, which is the difference in delay amounts between the first delay section 14-1 and the second delay section 14-2. The counter 50 may count the number of pulses of the first oscillated signal, instead of the second oscillated signal. Since the counter 50 counts the number of pulses until the first transition of the logic value output by the first sampling section 30-1, the same results can be obtained regardless of which of the first oscillated signal and the second oscillated signal is counted. The measurement apparatus 100 may have a configuration that includes only one of the memory 40 and the counter 50.

Figure 2:
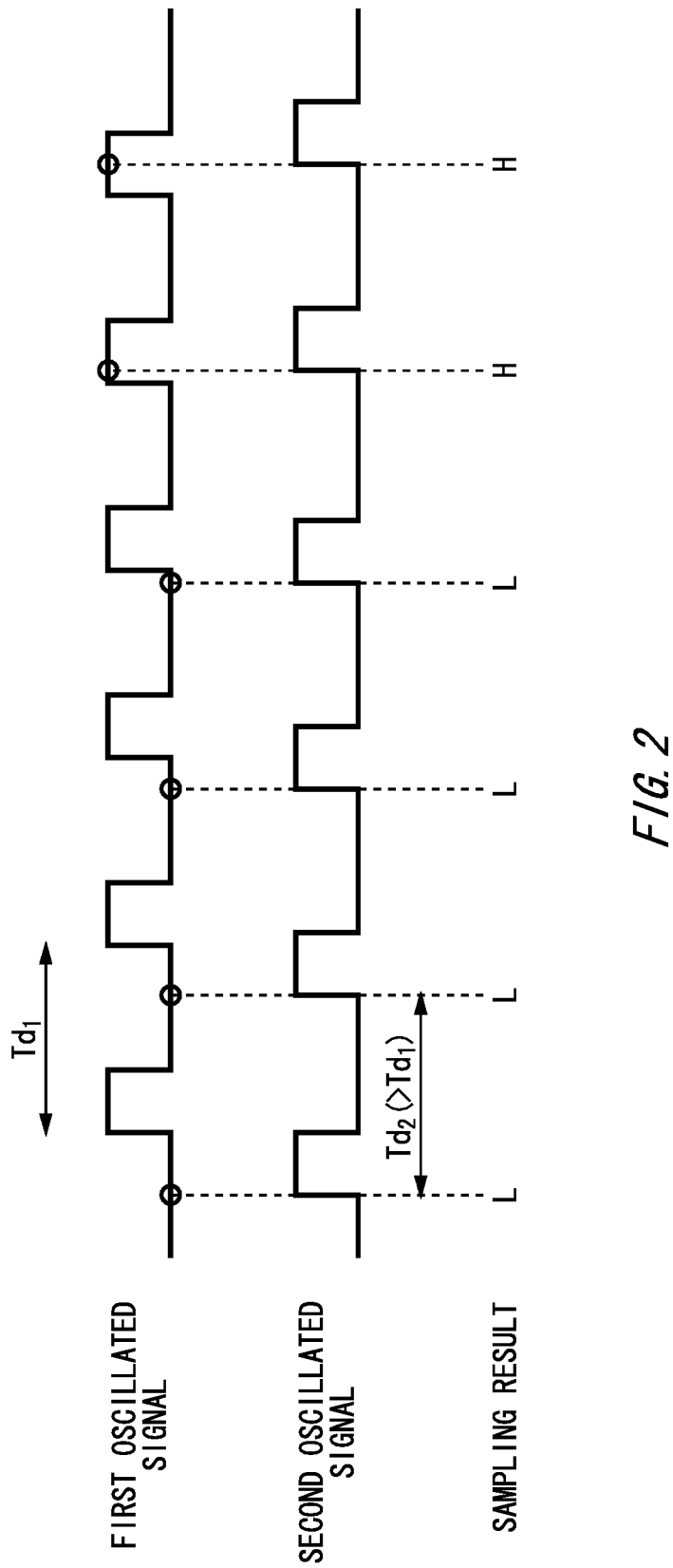
FIG. 2 is a timing chart showing an exemplary operation of the measurement apparatus 100 described in FIG. 1.

FIG. 2 is a timing chart showing an exemplary operation of the measurement apparatus 100 described in FIG. 1. As described above, the first oscillation circuit 10-1 outputs the first oscillated signal having a period that is the first delay amount $Td_1$ of the first delay section 14-1. The second oscillation circuit 10-2 outputs the second oscillated signal having a period that is the second delay amount $Td_2$ of the second delay section 14-2.

The first delay amount $Td_1$ and the second delay amount $Td_2$ are different from each other, and so the relative phase of the pulses of the second oscillated signal with respect to the pulses of the first oscillated signal changes according to the difference between $Td_1$ and $Td_2$ in each oscillation cycle of the second oscillation circuit 10-2. For example, when the second delay amount $Td_2$ is greater than the first delay amount $Td_1$, as shown in FIG. 2, the pulses of the second oscillated signal each have relative phases with respect to the pulses of the first oscillated signal that are delayed by $Td_2$-$Td_1$ in each cycle. Therefore, the first sampling section 30-1 samples one pulse of the signal under measurement with a resolution of $Td_2$-$Td_1$.

When the second delay amount $Td_2$ is greater than the first delay amount $Td_1$, the second selector 12-2 passes the pulse, from among the pulses of the reference signal, whose phase is ahead of the pulse of the signal under measurement passed by the first selector 12-1. When the second delay amount $Td_2$ is less than the first delay amount $Td_1$, the second selector 12-2 passes the pulse, from among the pulses of the reference signal, whose phase is behind the pulse of the signal under measurement passed by the first selector 12-1. By generating the first oscillated signal and the second oscillated signal using these pulses, the pulse of the signal under measurement can be measured.

If the second delay amount $Td_2$ is greater than the first delay amount $Td_1$, the reference signal generating section may generate the reference signal to have a phase that is ahead of the phase of the signal under measurement. In this case, the initial phase of the second oscillated signal is ahead of the initial phase of the first oscillated signal. The relative phase of the second oscillated signal is then gradually delayed in each cycle of the first oscillated signal and the second oscillated signal, such that the phase relationship becomes reversed. The phase difference between the signal under measurement and the reference signal can be detected by detecting the timing at which the logic value output by the first sampling section 30-1 transitions. When the second delay amount $Td_2$ is less than the first delay amount $Td_1$, the reference signal generating section may generate the reference signal to have a phase that is behind the phase of the signal under measurement.

The first control section 16-1 and the second control section 16-2 may stop the oscillation of the first oscillation circuit 10-1 and the second oscillation circuit 10-2 after a number of pulse oscillations corresponding to a measurement range over which measurement is performed. For example, when detecting the logic value transition points of the signal under measurement over a measurement range with a timing width of $N \cdot (Td_2-Td_1)$, the first control section 16-1 and the second control section 16-2 may select the second input terminals of the first selector 12-1 and the second selector 12-2 to stop the loop oscillation when the number of cycles of the first oscillated signal and the second oscillated signal reaches N. The first control section 16-1 and the second control section 16-2 may include counters that count the number of pulses passing to the first loop line 18-1 and the second loop line 18-2. The first control section 16-1 and the second control section 16-2 may stop the oscillation by the first oscillation circuit 10-1 and the second oscillation circuit 10-2 when the count value becomes a predetermined value corresponding to the measurement range.

Figure 3:
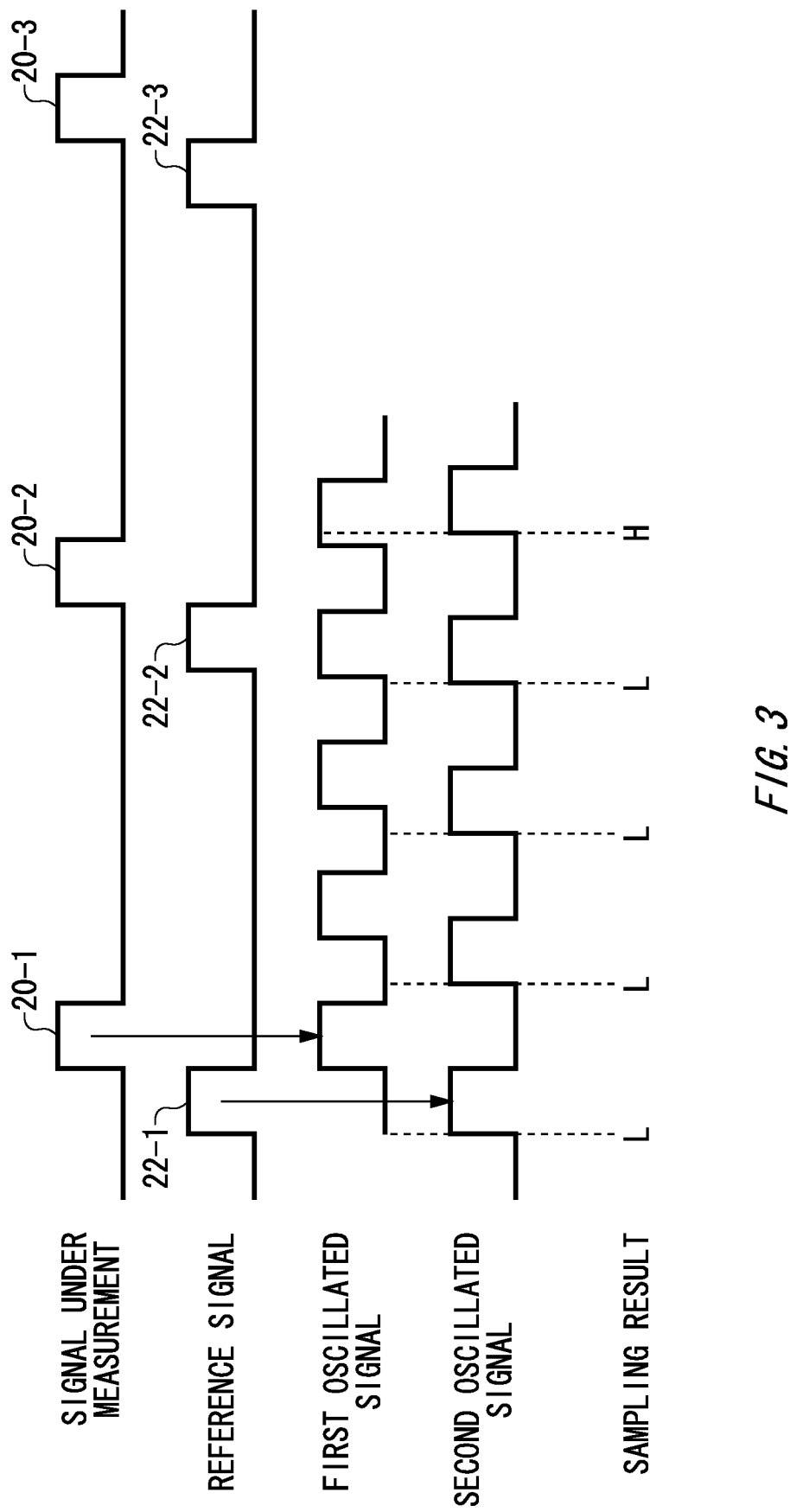
FIG. 3 is a timing chart showing another exemplary operation of the measurement apparatus 100 described in FIG. 1.

FIG. 3 is a timing chart showing another exemplary operation of the measurement apparatus 100 described in FIG. 1. As described in FIG. 2, the measurement apparatus 100 selects one pulse of the signal under measurement and measures this pulse. For example, as shown in FIG. 3, a pulse 20-1 of the signal under measurement is selected to generate the first oscillated signal. Furthermore, the pulse 22-1 of the reference signal corresponding to this selected pulse 20-1 is selected to generate the second oscillated signal.

When a plurality of pulses of the signal under measurement, such as 20-1, 20-2, 20-3, etc., are being measured in order to measure jitter or the like of the signal under measurement, adjacent pulses cannot be measured. One such example is when the first oscillation circuit 10-1 and the second oscillation circuit 10-2 perform loop oscillation for a number of loops corresponding to the measurement range, according to the pulse 20-1 of the signal under measurement and the pulse 22-1 of the reference signal.

As shown in FIG. 3, when a subsequent pulse 20-2 of the signal under measurement and a subsequent pulse 22-2 of the reference signal are input to the first oscillation circuit 10-1 and the second oscillation circuit 10-2 while the first oscillation circuit 10-1 and the second oscillation circuit 10-2 are generating the first oscillated signal and the second oscillated signal, the first oscillation circuit 10-1 and the second oscillation circuit 10-2 cannot generate the oscillated signals corresponding to the pulses 20-2 and 22-2. In other words, the adjacent pulses of the signal under measurement cannot be measured continuously depending on the period of the signal under measurement, the measurement range over which the signal under measurement is to be measured, and the measurement resolution.

Figure 4:
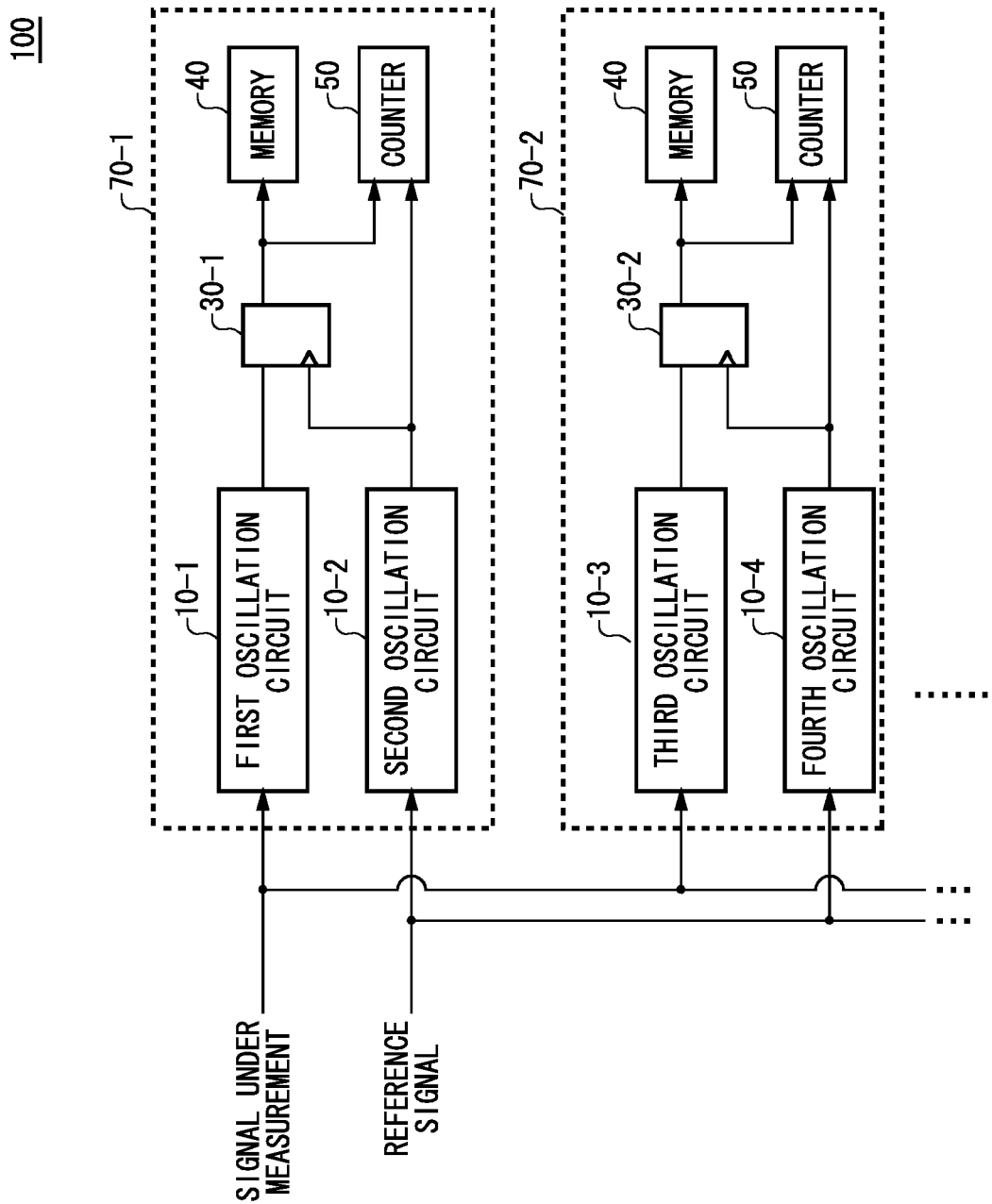
FIG. 4 shows another exemplary configuration of the measurement apparatus 100.

FIG. 4 shows another exemplary configuration of the measurement apparatus 100. The measurement apparatus 100 measures adjacent pulses of the signal under measurement continuously, regardless of the period of the signal under measurement and the measurement range over which the signal under measurement is to be measured. The measurement apparatus 100 of the present embodiment functions as a parallel measurement apparatus including a plurality of oscillation circuit units 70 arranged in parallel. Each oscillation circuit unit 70 may have the same configuration as the measurement apparatus 100 described in relation to FIG. 1. In other words, each oscillation circuit unit 70 may include a first oscillation circuit 10-1, a second oscillation circuit 10-2, a first sampling section 30-1, a memory 40, and a counter 50.

For ease of explanation, the following describes a case in which only two units, a first oscillation circuit unit 70-1 and a second oscillation circuit unit 70-2, are provided. For further ease of explanation, the first oscillation circuit 10-1, the second oscillation circuit 10-2, and the first sampling section 30-1 in the second oscillation circuit unit 70-2 are referred to as the third oscillation circuit 10-3, the fourth oscillation circuit 10-4, and the second sampling section 30-2.

The third oscillation circuit 10-3 and the fourth oscillation circuit 10-4 may have the same configuration as the first oscillation circuit 10-1 and the second oscillation circuit 10-2. The third delay amount of the third delay section 14-3, not shown, in the third oscillation circuit 10-3 is the same as the first delay amount in the first oscillation circuit 10-1. Similarly, the fourth delay amount of the fourth delay section 14-4, not shown, in the fourth oscillation circuit 10-4 is the same as the second delay amount of the second oscillation circuit 10-2. Therefore, the third oscillation circuit 10-3 outputs a third oscillated signal whose period is substantially equal to that of the first oscillated signal, and the fourth oscillation circuit 10-4 outputs a fourth oscillated signal whose period is the same as that of the second oscillated signal.

The third oscillation circuit 10-3 receives a different pulse of the signal under measurement than the first oscillation circuit 10-1, and begins oscillating according to this pulse to output the third oscillated signal. For example, as shown in FIG. 3, the third oscillation circuit 10-3 may receive the pulse 20-2 of the signal under measurement, which is after the pulse 20-1 input to the first oscillation circuit 10-1. The third selector 12-3, not shown, of the third oscillation circuit 10-3 may select and pass this pulse.

The fourth oscillation circuit 10-4 receives, from among the pulses of the reference signal, the pulse corresponding to the pulse of the signal under measurement that is input to the third oscillation circuit 10-3, and begins oscillating according this pulse to output the fourth oscillated signal. For example, as shown in FIG. 3, the fourth oscillation circuit 10-4 may receive the pulse 22-2 of the reference signal, which is after the pulse 22-1 input to the second oscillation circuit 10-2. The following describes the pulses of the reference signal corresponding to the pulses of the signal under measurement input to the third oscillation circuit 10-3.

In the present embodiment, the reference signal has substantially the same period as the signal under measurement. The measurement apparatus 100 may further include a reference signal generating section that generates the reference signal to have substantially the same period as the signal under measurement. The reference signal generating section may use a PLL circuit or the like to generate the reference signal to have substantially the same period as the signal under measurement. The reference signal generating section branches the reference signal to be input to both the second oscillation circuit 10-2 and the fourth oscillation circuit 10-4.

The pulse of the signal under measurement selected by the first oscillation circuit 10-1 and the pulse of the reference signal selected by the second oscillation circuit 10-2 have a phase difference therebetween. In this case, the fourth oscillation circuit 10-4 receives, as the pulse of the reference signal corresponding to the pulse of the signal under measurement input to the third oscillation circuit 10-3, the pulse of the reference signal having this phase difference with respect to the pulse of the signal under measurement input to the third oscillation circuit 10-3. In other words, when the third oscillation circuit 10-3 receives the pulse that follows the pulse of the signal under measurement input to the first oscillation circuit 10-1, the fourth oscillation circuit 10-4 receives the pulse that follows the pulse of the reference signal input to the second oscillation circuit 10-2.

The second sampling section 30-2 samples the third oscillated signal according to the pulse of the fourth oscillated signal. The memory 40 stores the sampling results obtained by the second sampling section 30-2. The counter 50 detects the timing at which the logic value output by the second sampling section 30-2 transitions. With this configuration, the measurement apparatus 100 can continuously measure adjacent pulses of the signal under measurement, regardless of the period of the signal under measurement and the measurement range over which the signal under measurement is to be measured. The measurement apparatus 100 may include a larger number of oscillation circuits 10, sampling sections 30, and memories 40 or counters 50 depending on the number of pulses of the signal under measurement that are to be measured. The measurement apparatus 100 may include a number of oscillation circuits 10, sampling sections 30, and memories 40 or counters 50 sufficient to enable measurement of each pulse of the signal under measurement according to the period of the signal under measurement and the measurement range over which the phases of the pulses of the signal under measurement are to be measured.

Figure 5:
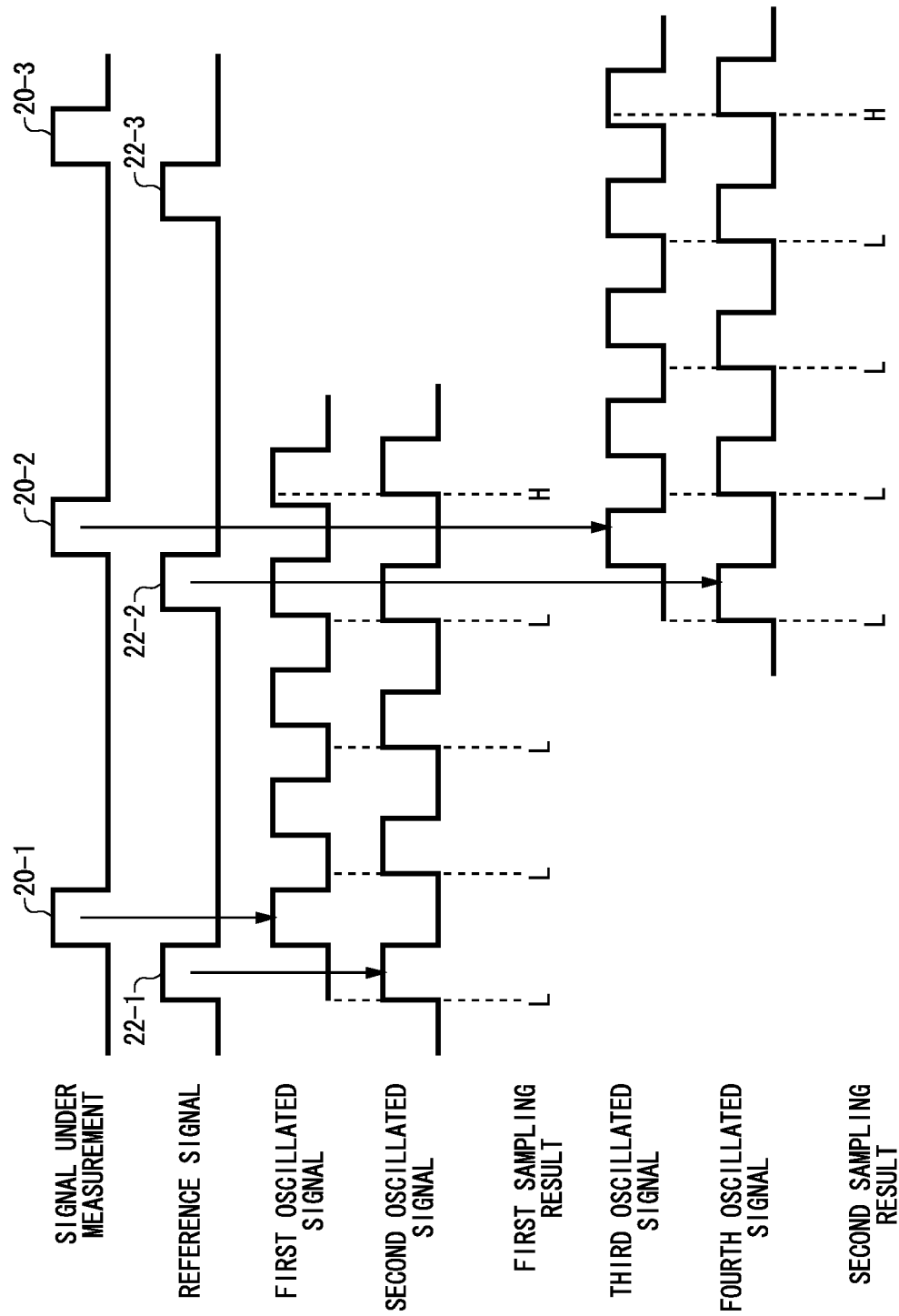
FIG. 5 shows another exemplary operation of the measurement apparatus 100 described in FIG. 4.

FIG. 5 shows another exemplary operation of the measurement apparatus 100 described in FIG. 4. As described above, the first oscillation circuit 10-1 and the second oscillation circuit 10-2 perform oscillation according to the pulse 20-1 of the signal under measurement and the pulse 22-1 of the reference signal. Furthermore, the third oscillation circuit 10-3 and the fourth oscillation circuit 10-4 perform oscillation according to the subsequent pulse 20-2 of the signal under measurement and the subsequent pulse 22-2 of the reference signal.

Therefore, as shown in FIG. 5, each pulse of the signal under measurement can be measured even when the oscillation of the first oscillation circuit 10-1 and the second oscillation circuit 10-2 ends after the timing of the subsequent pulses 20-2 and 22-2. In the measurement apparatus 100 of the present embodiment, however, a plurality of oscillation circuits 10 are provided according to the number of pulses to be measured in the signal under measurement. Therefore, the circuit size increases proportionally with the measurement range, and also increases proportionally with higher time resolution.

Figure 6:
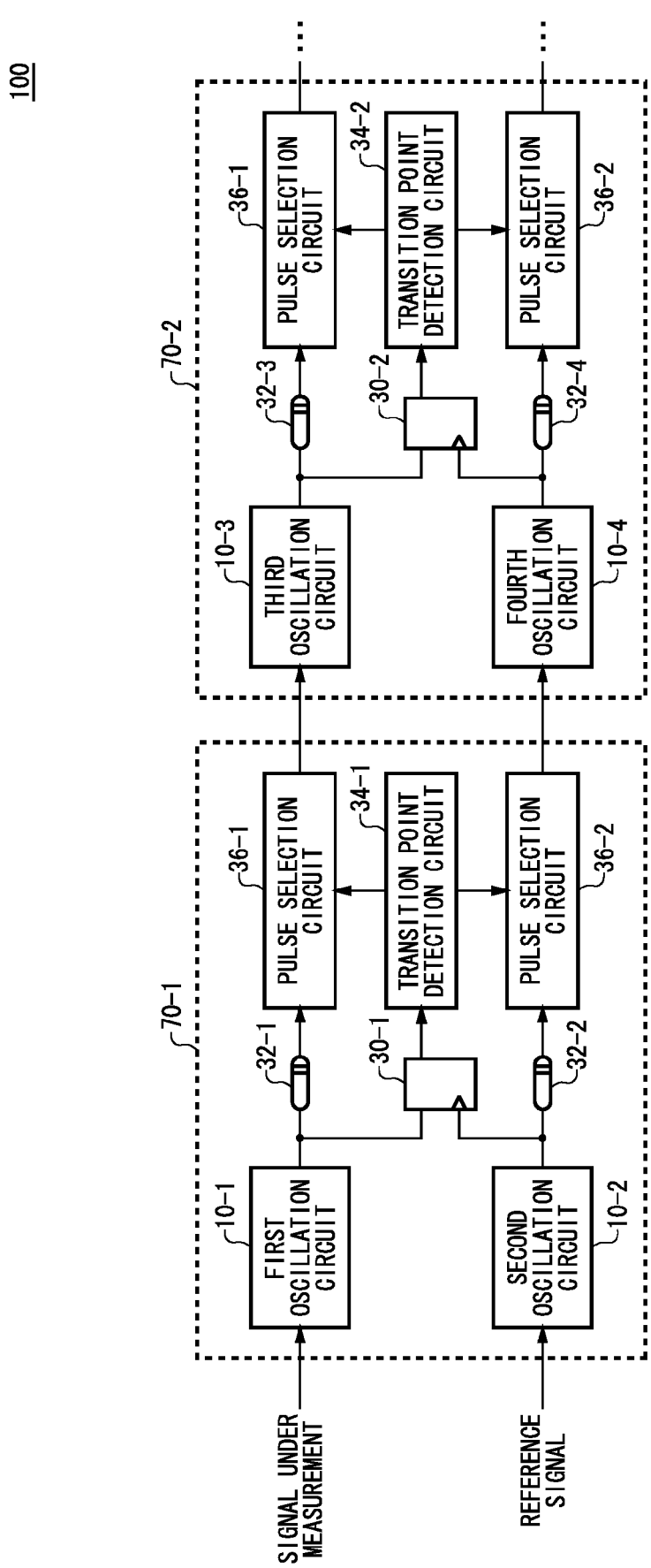
FIG. 6 shows another exemplary configuration of the measurement apparatus 100.

FIG. 6 shows another exemplary configuration of the measurement apparatus 100. The measurement apparatus 100 of the present embodiment uses a relatively small circuit to measure a high-frequency signal under measurement with a high resolution over a wide measurement range. The measurement apparatus 100 of the present embodiment includes a plurality of oscillation circuit units 70 connected in cascade. Each oscillation circuit unit 70 includes a first oscillation circuit 10-1, a second oscillation circuit 10-2, delay elements 32-1 and 32-2, a first sampling section 30-1, pulse selection circuits 36-1 and 36-2, and a changing point detection circuit 34-1. In the present embodiment, components that have the same function and configuration as components in FIG. 1 are given the same reference numerals.

Each first oscillation circuit 10-1 begins oscillating according to the received pulse to output a first oscillated signal. Each second oscillation circuit 10-2 begins oscillating according to the received pulse to output a second oscillated signal whose period differs from that of the first oscillated signal. The first oscillation circuit 10-1 of the first-stage oscillation circuit unit 70-1 receives one pulse of the signal under measurement, and the second oscillation circuit 10-2 receives one pulse of the reference signal. The oscillation circuit units 70 other than the first-stage oscillation circuit unit 70-1 in the first oscillation circuit 10-1 each receive one pulse of the first oscillated signal output by the oscillation circuit unit 70 at the previous stage, and the second oscillation circuit 10-2 receives one pulse of the second oscillated signal output by the oscillation circuit unit 70 at the previous stage.

For ease of explanation, the following describes an embodiment in which two units, the first oscillation circuit unit 70-1 and the second oscillation circuit unit 70-2, are provided. For further ease of explanation, the components in the second oscillation circuit unit 70-2 are referred to as the third oscillation circuit 10-3 (corresponding to the first oscillation circuit 10-1), the fourth oscillation circuit 10-4 (corresponding to the second oscillation circuit 10-2), the delay elements 32-3 and 32-4, the second sampling section 30-2, the pulse selection circuits 36-3 and 36-4, and the changing point detection circuit 34-2. Furthermore, although the memory 40 and the counter 50 are not shown in FIG. 6, the measurement apparatus 100 may include at least one of the memory 40 and the counter 50 corresponding to each sampling section 30.

The first oscillation circuit 10-1, the second oscillation circuit 10-2, and the first sampling section 30-1 may have the same configuration as the first oscillation circuit 10-1, the second oscillation circuit 10-2, and the first sampling section 30-1 described in relation to FIG. 1. The third oscillation circuit 10-3 receives one pulse of the first oscillated signal output by the first oscillation circuit 10-1 of the oscillation circuit unit 70 at the previous stage, and begins oscillating according to the received pulse to output the third oscillated signal. The fourth oscillation circuit 10-4 receives one pulse of the second oscillated signal output by the second oscillation circuit 10-1 of the oscillation circuit unit 70 at the previous stage, and begins oscillating according to the received pulse to output the fourth oscillated signal. The third oscillation circuit 10-3 and the fourth oscillation circuit 10-4 may have the same configuration as the first oscillation circuit and the second oscillation circuit 10-2. The second sampling section 30-2 samples the third oscillated signal according to a pulse of the fourth oscillated signal.

The third oscillation circuit 10-3 may receive a pulse of the first oscillated signal in a cycle in which a transition of the logic value output by the first sampling section 30-1 is detected, i.e. a cycle that is immediately after the trailing/leading relationship between the phase of the edge of the second oscillated signal and the phase of the edge of the first oscillated signal inverts. The fourth oscillation circuit 10-4 may receive a pulse of the second oscillated signal in a cycle in which a transition of the logic value output by the first sampling section 30-1 is detected.

The pulse selection circuits 36-1 and 36-2 of the first oscillation circuit unit 70-1 select the pulses of the first oscillated signal and the second oscillated signal described above, and input the selected pulses to the third oscillation circuit 10-3 and the fourth oscillation circuit 10-4 of the second oscillation circuit unit 70-2 provided at the subsequent stage. At this time, the first oscillation circuit 10-1, the second oscillation circuit 10-2, and the pulse selection circuits 36-1 and 36-2 maintain the relative phase between the pulse of the first oscillated signal and the pulse of the second oscillated signal to be the same as the relative phase in a cycle in which a transition of the logic value output by the first sampling section 30-1 is detected, and input these pulses into the third oscillation circuit and the fourth oscillation circuit.

The changing point detection circuit 34-1 of the first oscillation circuit unit 70-1 detects the cycle in which the logic value output by the first sampling section 30-1 transitions, and notifies the pulse selection circuits 36-1 and 36-2. The delay elements 32-1 and 32-2 are provided respectively between the first oscillation circuit 10-1 and the pulse selection circuit 36-1 and between the second oscillation circuit 10-2 and the pulse selection circuit 36-2. The delay times of the delay elements 32-1 and 32-2 may be determined according to the time necessary for the signal processing by the first sampling section 30-1, the changing point detection circuit 34-1, and the pulse selection circuits 36-1 and 36-2. By delaying the signals input to the pulse selection circuits 36-1 and 36-2, the pulse selection circuits 36-1 and 36-2 can select and output the pulses of the first oscillated signal and the second oscillated signal in a cycle in which the changing point detection circuit 34-1 detects a transition point.

Figure 7:
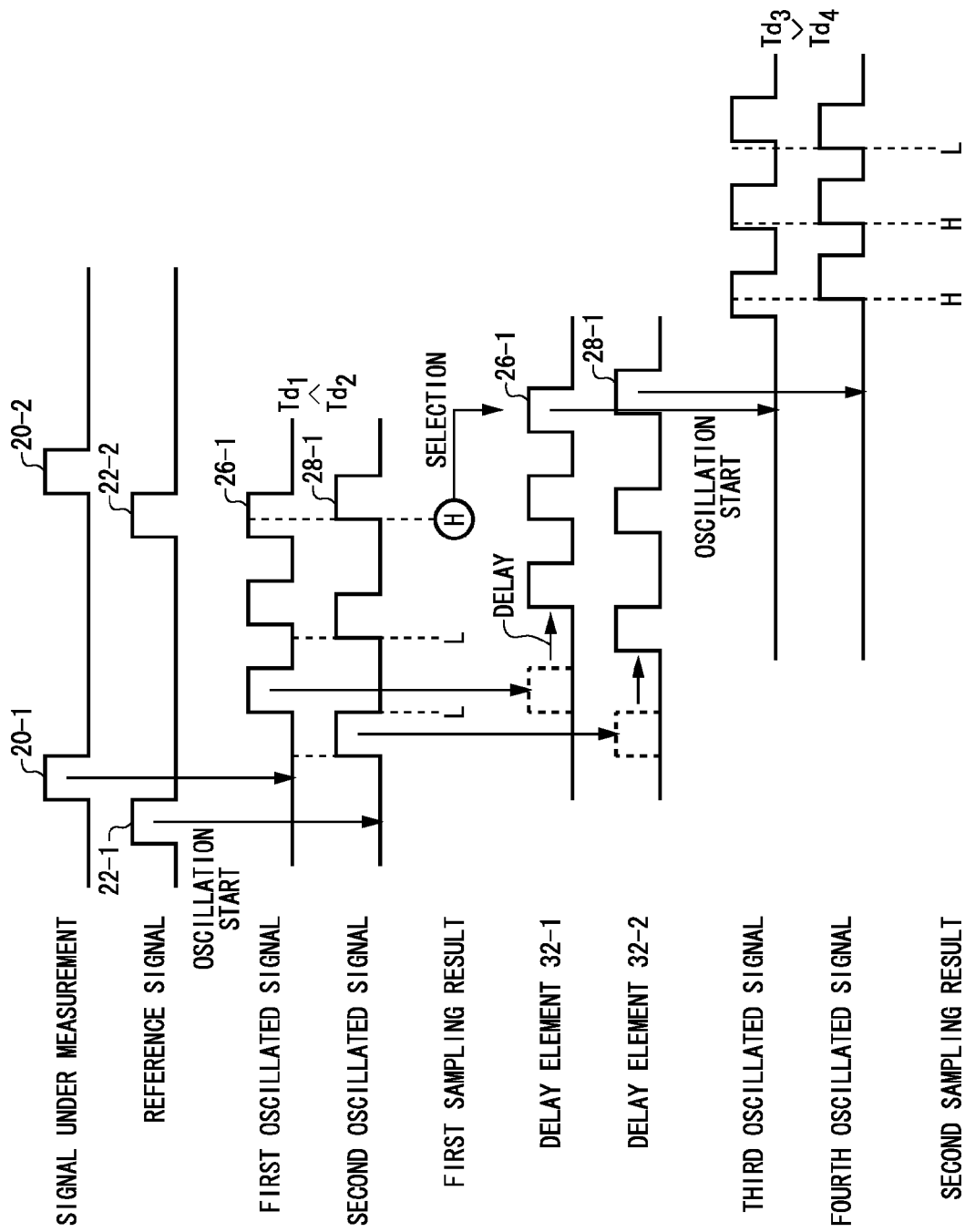
FIG. 7 is a timing chart showing an exemplary operation of the measurement apparatus 100 described in FIG. 6.

FIG. 7 is a timing chart showing an exemplary operation of the measurement apparatus 100 described in FIG. 6. As described above, the first oscillation circuit 10-1 and the second oscillation circuit 10-2 output the first oscillated signal and the second oscillated signal according to one pulse 20-1 of the signal under measurement and one pulse 22-1 of the reference signal. The changing point detection circuit 34 detects the cycle in which the logic value of the first sampling result output by the first sampling section 30-1 changes. In the example of FIG. 7, the logic value of the first sampling result changes in the third cycle of the first oscillated signal and the second oscillated signal.

The delay elements 32 maintain the phase difference between the first oscillated signal and the second oscillated signal input thereto, and delay these signals by the same amount. The delay elements 32 delay the first oscillated signal and the second oscillated signal such that the transmission delay time between the first oscillation circuit 10-1 and the pulse selection circuit 36 and the transmission delay time between the second oscillation circuit 10-2 and the pulse selection circuit 36 are equal to each other. The delay elements 32 may each have the same delay amount.

The pulse selection circuit 36 selects the pulse 26-1 of the first oscillated signal and the pulse 28-1 of the second oscillated signal in the cycle in which the changing point detection circuit 34 detects a transition point, and input these pulses to the third oscillation circuit 10-3 and the fourth oscillation circuit 10-4. The third oscillation circuit 10-3 and the fourth oscillation circuit 10-4 begin oscillating according to these pulses to output the third oscillated signal and the fourth oscillated signal.

At this time, the oscillation period, i.e. the delay amount of the delay section 14, of each oscillation circuit 10 is set such that the absolute value $|Td_1-Td_2|$ of a first subtraction value, which is obtained by subtracting the oscillation period $Td_2$ of the second oscillation circuit 10-2 from the oscillation period $Td_1$ of the first oscillation circuit 10-1, is greater than the absolute value $|Td_3-Td_4|$ of a second subtraction value, which is obtained by subtracting the oscillation period $Td_4$ of the fourth oscillation circuit 10-4 from the oscillation period of the third oscillation circuit 10-3. As a result, the sampling resolution of the second sampling section 30-2 is less than the sampling resolution of the first sampling section 30-1.

Furthermore, the oscillation periods are set such that the sign of the first subtraction value $Td_1-Td_2$ is different from the sign of the second subtraction value $Td_3-Td_4$. For example, when $Td_1$ is less than $Td_2$, $Td_3$ is set to be greater than $Td_4$. In this case, as shown in FIG. 7, in each cycle, the relative phase of the pulse of the second oscillated signal gradually falls further behind the pulse of the first oscillated signal. The changing point detection circuit 34 detects the cycle in which the phase of the pulse of the second oscillated signal changes from being ahead of to being behind the pulse of the first oscillated signal, maintains the relative phases of the pulses of the first oscillated signal and the second oscillated signal in this cycle, and inputs these pulses to the third oscillation circuit 10-3 and the fourth oscillation circuit 10-4.

As shown in FIG. 7, the relative phase of the pulse of the fourth oscillated signal relative to the pulse of the third oscillated signal gradually moves further ahead at higher resolutions. In other words, the scanning direction of the sampling of the first sampling section 30-1 and the second sampling section 30-2 becomes reversed. Therefore, the changing point detection circuit 34 corresponding to the second sampling section 30-2 has a higher resolution when detecting the cycle in which the phase of the pulse of the fourth oscillated signal changes from being behind the pulse of the third oscillated signal to being ahead of this pulse.

The third oscillation circuit 10-3 and the fourth oscillation circuit 10-4 receive the first oscillated signal and the second oscillated signal in the cycle immediately after the leading/trailing relationship changes. In other words, the phase difference between the signals input to the third oscillation circuit 10-3 and the fourth oscillation circuit 10-4 is less than a unit of the resolution $Td_2-Td_1$ in the first-stage circuit. Therefore, the measurement range of the second-stage oscillation circuit unit 70-2 can be set to have the time resolution of the first-stage oscillation circuit unit 70-1. Furthermore, the second-stage oscillation circuit unit 70-2 can perform measurement with a higher time resolution, even when the number of loops is the same as for the first-stage oscillation circuit unit 70-1.

In each oscillation circuit 10, the dead time, which is the interval from when one pulse of the signal under measurement is measured to when the next pulse can be measured, depends on the number of oscillations necessary to measure the one pulse. The measurement apparatus 100 of the present embodiment can reduce the number of oscillations at each stage, thereby reducing dead time, and can therefore efficiently measure the pulses of the signal under measurement.

In this way, the measurement apparatus 100 can detect the edge timing of pulses of the signal under measurement, based on the detection results of the changing point detection circuits 34 corresponding to the first sampling section 30-1 and the second sampling section 30-2. For example, when the changing point detection circuit 34 corresponding to the first sampling section 30-1 detects a transition point in an a-th cycle after the first oscillation circuit 10-1 and the second oscillation circuit 10-2 begin oscillating and the changing point detection circuit 34 corresponding to the second sampling section 30-2 detects a transition point in a b-th cycle after the third oscillation circuit 10-3 and the fourth oscillation circuit 10-4 begin oscillating, the measurement apparatus 100 can calculate the edge timing of the pulse of the signal under measurement with the edge timing of the pulse of the reference signal as a reference, using the equation $a \cdot (Td_2-Td_1)-b \cdot (Td_3-Td_4)$.

By connecting a plurality of oscillation circuit units 70 in cascade and setting the oscillation periods in the oscillation circuit units 70 at later stages such that the absolute value of the oscillation period difference between the first oscillation circuit 10-1 and the second oscillation circuit 10-2 becomes progressively smaller in oscillation circuit units 70 at each subsequent stage, in the manner described above, the measurement resolution can be sequentially increased. Furthermore, by setting the oscillation periods such that the positive/negative sign of a subtraction value, which is obtained by subtracting the oscillation period of the second oscillation circuit 10-2 from the oscillation period of the first oscillation circuit 10-1, to be different for adjacent oscillation circuit units 70, the phase direction of the scanning of the oscillated signals can be sequentially reversed. In other words, the signal under measurement can be measured with high resolution, and since the resolution units are larger at early stage oscillation circuits 10, measurement can be performed over a wide measurement range using a small number of oscillations.

The oscillation circuits 10 at later stages receive the two oscillated signal pulses whose relative phases are maintained to be the same as these relative phases in the cycle for which the previous-stage oscillation circuit 10 detects a transition point. Therefore, even the oscillation circuits 10 at later stages can detect transition points in a small number of cycles. As a result, even when measuring pulses of a high-frequency signal under measurement, the measurement can be performed with high resolution over a wide measurement range.

In the measurement apparatus 100 shown in FIG. 1, the oscillation circuits 10 perform a number of oscillations equal to the measurement range divided by a unit of resolution. On the other hand, in the measurement apparatus 100 of FIG. 6, the oscillation circuits 10 at earlier stages detect transition points with lower resolution, and the oscillation circuits 10 at later stages detect the transition points with higher resolution. Furthermore, the oscillation circuits 10 at each stage detect the transition point using the oscillated signals of a cycle that is immediately after the oscillation circuits 10 at earlier stages detect the transition point, and so the number of oscillations necessary to perform measurement with the same resolution as the measurement apparatus 100 of FIG. 1 can be greatly decreased.

The present embodiment describes a case where two stages of oscillation circuit units 70 are connected in cascade, but the measurement apparatus 100 may include a larger number of stages of oscillation circuit units 70 connected in cascade. With such a configuration, the measurement apparatus 100 can measure the signal under measurement with even higher resolution. Furthermore, in the present embodiment, the pulses of the first oscillated signal and the second oscillated signal in a cycle in which a transition point is detected are input to the oscillation circuit unit 70 at the next stage, but as another example, the pulses of the first oscillated signal and the second oscillated signal in a cycle that is a predetermined number of cycles after the cycle in which the transition point is detected can be input to the oscillation circuit unit 70 at the next stage. In this case, the timing of the transition point detected by the changing point detection circuit 34 of the oscillation circuit unit 70 at the next stage is adjusted according to the number of predetermined cycles. For example, a value obtained as the product of the number of cycles and the measurement resolution of the oscillation circuit unit 70 at the previous stage can be added to or subtracted from the timing detected by the changing point detection circuit 34 at the following stage.

The phase difference between the signal under measurement and the reference signal can be calculated from the sum of values that are each obtained as a product of the number of cycles detected by a changing point detection circuit 34 and the corresponding resolution for each stage in the measurement apparatus 100. It should be noted that, as described above, an oscillation circuit unit 70 receives, as output from the oscillation circuit unit 70 at the previous stage, oscillated signals whose relative phases are kept the same as in a cycle immediately after the phase relationship is reversed, and so the scanning direction of the phases is also reversed. Therefore, the phase difference between the signal under measurement and the reference signal cannot be accurately obtained using a normal remainder system in which the product of the resolution and the number of cycles at each stage are simply added together. The following describes a method by which the measurement apparatus 100 shown in FIG. 6 obtains the phase difference between the signal under measurement and the reference signal based on the detection result of the changing point detection circuit 34 at each stage, i.e. the remainder system of the measurement apparatus 100 shown in FIG. 6.

Figure 8:
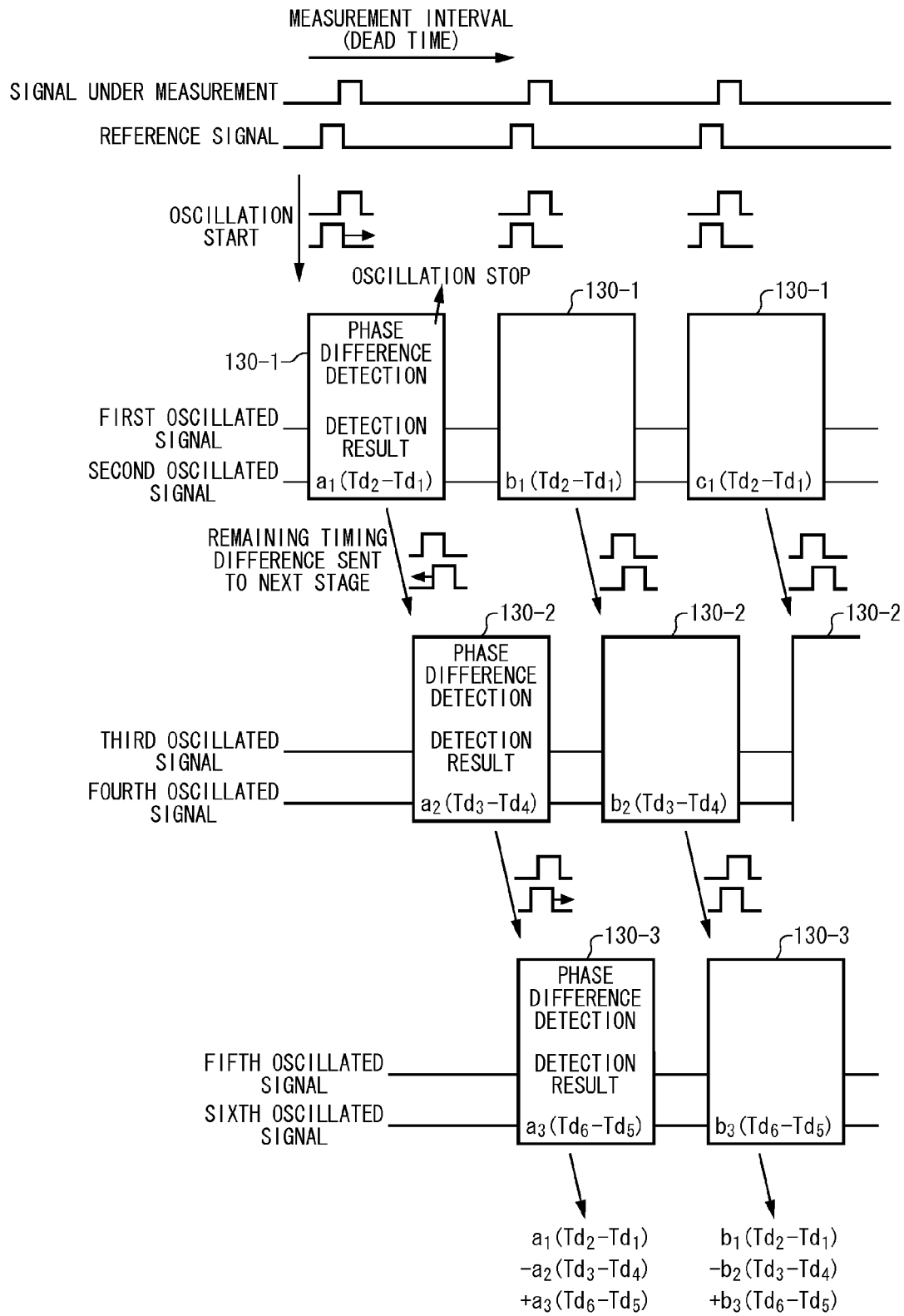
FIG. 8 shows an exemplary relational expression of the remainder system according to the present embodiment.

FIGS. 8 to 11 provide descriptions of a system for handling remainders in the measurement apparatus 100 shown in FIG. 6. FIG. 8 shows an exemplary relational expression of the remainder system according to the present embodiment. FIG. 8 describes a case in which the first oscillation circuit 10-1 and the second oscillation circuit 10-2 generate the oscillated signals according to the pulses of the signal under measurement and the reference signal. Furthermore, FIG. 8 describes a case in which the oscillation period $Td_2$ of the second oscillation circuit 10-2 is greater than the oscillation period $Td_1$ of the first oscillation circuit 10-1. In other words, in the present embodiment, the phase of the second oscillated signal gradually falls behind the phase of the first oscillated signal. In this case, the reference signal generating section preferably generates the reference signal to have a phase ahead of the phase of the signal under measurement. On the other hand, when the oscillation period $Td_2$ of the second oscillation circuit 10-2 is greater than the oscillation period $Td_1$ of the first oscillation circuit 10-1, the reference signal generating section preferably generates the reference signal to have a phase behind the phase of the signal under measurement.

FIG. 8 describes a case in which three stages of oscillation circuit units 70 are connected in cascade. In the present embodiment, the first oscillation circuit 10-1 and the second oscillation circuit 10-2 of the third-stage oscillation circuit unit 70 are referred to as the fifth oscillation circuit 10-5 and the sixth oscillation circuit 10-6. In this case, the oscillation periods of the oscillation circuits 10 are set such that the scanning direction of the sampling sequentially reverses between oscillation circuit units 70 at odd-numbered stages and oscillation circuit units 70 at even-numbered stages. In the example of FIG. 8, the oscillation periods are set such that the oscillation period $Td_1$ of the first oscillation circuit 10-1 is less than the oscillation period $Td_2$ of the second oscillation circuit 10-2, the oscillation period $Td_3$ of the third oscillation circuit 10-3 is greater than the oscillation period $Td_4$ of the fourth oscillation circuit 10-4, and the oscillation period $Td_5$ of the fifth oscillation circuit 10-5 is greater than the oscillation period $Td_6$ of the sixth oscillation circuit 10-6.

The measurement apparatus 100 may include a calculating section that performs a process based on the relational expression shown in FIG. 8. The calculating section may be provided in advance with the resolution at each stage ($Td_2-Td_1$, $Td_3-Td_4$, $Td_6-Td_5$, etc.), and may receive notification regarding the number of each cycle in which a changing point detection circuit 34 detects a transition point for each stage. Here, the changing point detection circuit 34 at each stage may count the number of oscillations of the oscillation circuit unit 70, i.e. the number of cycles, from when the corresponding oscillation circuits 10 begin oscillating to when a transition point is detected. FIG. 8 shows function blocks of exemplary processes performed by the calculating section. The calculating section may include a first processing section 130-1 that performs a computation based on the detection result from the first-stage changing point detection circuit 34, a second processing section 130-2 that performs a computation based on the detection result from the second-stage changing point detection circuit 34, and a third processing section 130-3 that performs a computation based on the detection result from the third-stage changing point detection circuit 34

The first processing section 130-1 detects a number of cycles a1 of the first oscillated signal and the second oscillated signal, from when the first oscillation circuit 10-1 and the second oscillation circuit 10-2 begin oscillating to when the logic value output by the first sampling section 30-1 transitions. The first processing section 130-1 detects the phase difference by multiplying the detected number of cycles a1 by the corresponding resolution, i.e. the oscillation period difference $Td_2-Td_1$ between the first oscillation circuit 10-1 and the second oscillation circuit 10-2.

The second processing section 130-2 detects a number of cycles a2 of the third oscillated signal and the fourth oscillated signal, from when the third oscillation circuit 10-3 and the fourth oscillation circuit 10-4 begin oscillating to when the logic value output by the second sampling section 30-2 transitions. The second processing section 130-2 detects the phase difference by multiplying the detected number of cycles a2 by the corresponding resolution, i.e. the oscillation period difference $Td_3-Td_4$ between the fourth oscillation circuit 10-4 and the third oscillation circuit 10-3. In the same way, the third processing section 130-3 calculates the product of the detected number of cycles a3 and the corresponding resolution ($Td_6-Td_5$).

Each oscillation circuit 10 stops oscillating when the corresponding changing point detection circuit 34 detects a change point, and begin oscillating again according to the next received pulse. For each pulse of the signal under measurement, the calculating section calculates the phase difference between the pulse of the signal under measurement and the corresponding pulse of the reference signal, based on the phase differences detected by the first processing section 130-1, the second processing section 130-2, and the third processing section 130-3 for the corresponding pulse of the signal under measurement.

For example, the calculating section may calculate the phase difference between a first pulse of the signal under measurement and a first pulse of the reference signal based on the corresponding phase differences detected by the processing sections 130. Here, the scanning direction of the sampling at odd-numbered stages is the reverse of the scanning direction of the sampling at even-numbered stages, and so the phase difference between these first pulses can be obtained by calculating the difference between (i) the sum of the phase differences detected by the processing sections 130 corresponding to the odd-numbered stages, i.e. the first processing section 130-1 and the third processing section 130-3, and (ii) the sum of the phase differences detected by the processing sections 130 corresponding to the even-numbered stages, i.e. the second processing section 130-2. In the present embodiment, the phase difference between the pulses can be calculated using the expression $a1(Td_2-Td_1)-a2(Td_3-Td_4)+a3(Td_6-Td_5)$. The calculating section may use the same process to calculate the phase difference between each pulse of the signal under measurement and the corresponding pulse of the reference signal. The reference signal is generated by a measurer at an arbitrary timing, and so the above process can be used to obtain the phase variation, i.e. jitter, of each pulse of the signal under measurement.

Figure 9:
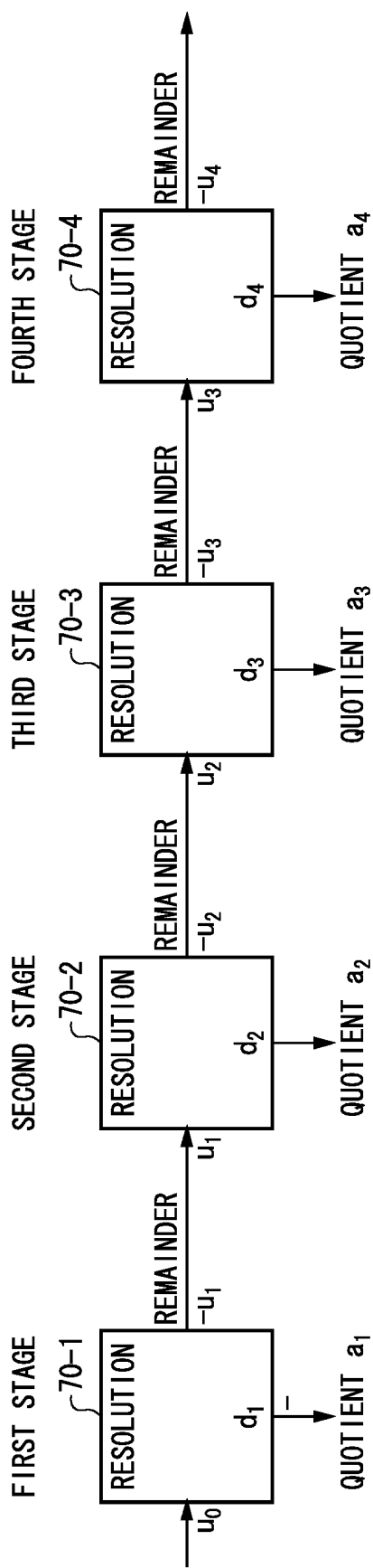
FIG. 9 describes the processes performed by each stage of oscillation circuit unit 70 in the measurement apparatus 100.

FIG. 9 describes the processes performed by each stage of oscillation circuit unit 70 in the measurement apparatus 100. Each oscillation circuit unit 70 has a resolution $d_1$, which may be $Td_2-Td_1$ for example, set according to the oscillation period difference between the pair of oscillation circuits 10, e.g. the first oscillation circuit 10-1 and the second oscillation circuit 10-2. The first oscillation circuit unit 70-1 receives the signal under measurement and the reference signal having a phase difference of $u_0$ therebetween. The first oscillation circuit unit 70-1 outputs a result obtained by dividing the phase difference $u_0$ by the resolution $d_1$.

Here, the quotient $a_n$ output by each oscillation circuit unit 70 is equal to the number of cycles from when the two oscillated signal are output to when the phase relationship of the oscillated signals inverts, and so the quotient $a_n$ can be obtained by adding 1 to the quotient obtained from $u_n/d_n$, where n is an integer. In other words, the quotient $a_n$ is output as the smallest integer fulfilling a condition that the product of the integer and the resolution $d_n$ is greater than the phase difference $u_n$. Furthermore, the input phase difference $u_n$ is subtracted from the product of the resolution $d_n$ and the quotient $a_n$, and the resulting value $d_n \times a_n - u_n$, which is a negative value, is input to the next stage as a remainder. In the present embodiment, the two oscillated signals having a relative phase difference corresponding to the remainder of this division are input to the oscillation circuit unit 70 at the next stage.

The next-stage oscillation circuit unit 70 receives the remainder, which is a negative value, of the phase difference output by the oscillation circuit unit 70 at the stage therebefore. The scanning direction of the sampling in the next-stage oscillation circuit unit 70 is opposite the scanning direction in the oscillation circuit unit 70 of the stage therebefore, and so the remainder of the phase difference becomes a positive value. The next-stage oscillation circuit unit 70 then outputs a result obtained by dividing the remainder of the phase difference by the resolution $d_n$, in the same manner as above.

The calculating section calculates the phase difference $u_0$ between an oscillated signal and the reference signal based on the product of the resolution $d_n$ and the quotient $a_n$ of each oscillation circuit unit 70. As described above, the calculating section can calculate the phase difference $u_0$ between an oscillated signal and the reference signal by subtracting the sum of the product of the resolution $d_n$ and the quotient $a_n$ of each oscillation circuit unit 70 at an odd-numbered stage from the sum of the product of the resolution $d_n$ and the quotient $a_n$ of each oscillation circuit unit 70 at an even-numbered stage. It should be noted that the phase difference $u_0$ is actually obtained by subtracting the sum of the product of the resolution $d_n$ and the quotient $a_n$ of each oscillation circuit unit 70 at an odd-numbered stage from the sum of the product of the resolution $d_n$ and the quotient $a_n$ of each oscillation circuit unit 70 at an even-numbered stage, and then adding the remainder output by the oscillation circuit unit 70 at the final stage. However, since the remainder output by the final-stage oscillation circuit unit 70 is less than the resolution of the final-stage oscillation circuit unit 70, this remainder can be treated as a quantization error. The resolution of the final-stage oscillation circuit unit 70 may be determined according to an allowable measurement error.

Figure 10:
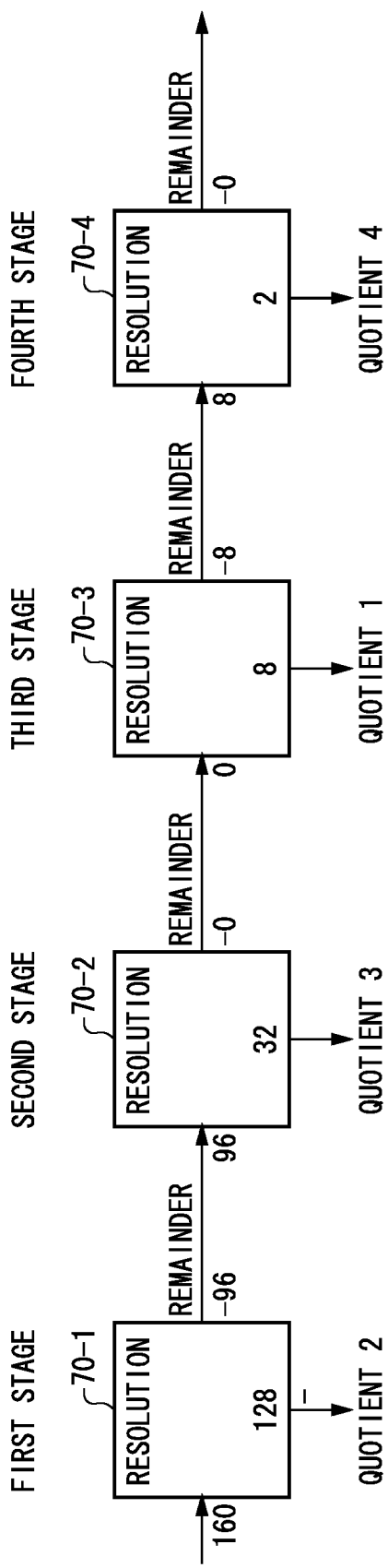
FIG. 10 describes a process performed at each stage of the measurement apparatus 100 when the resolutions of the oscillation circuit units 70 are respectively set to be "128," "32," "8," and "2."

FIG. 10 describes a process performed at each stage of the measurement apparatus 100 when the resolutions of the oscillation circuit units 70 are respectively set to be "128," "32," "8," and "2." Here, the units for the resolution may be time units, such as picoseconds. The signal under measurement and the reference signal in this example have a phase difference of "160." Here, the units for the phase difference may be the same as the units for the resolution.

The first oscillation circuit unit 70-1 divides the phase difference "160" between the signal under measurement and the reference signal by the resolution "128." As described above, the quotient output by an oscillation circuit unit 70 is a value obtained by adding 1 to the quotient obtained by normal division, and so the first oscillation circuit unit 70-1 outputs the quotient "2." Furthermore, the remainder output by the first oscillation circuit unit 70-1, which is the phase difference between the first oscillated signal and the second oscillated signal input to the second oscillation circuit unit 70-2, is calculated as 160−128×2, which is "−96."

The second oscillation circuit unit 70-2 receives the phase difference "−96" and, as described above, divides this phase difference by the resolution "32." Therefore, the quotient output by the second oscillation circuit unit 70-2 is "3," and the output remainder is "0." In the same way, the third oscillation circuit unit 70-3 outputs the quotient "1" and the remainder "8," and the fourth oscillation circuit unit 70-4 outputs the quotient "4" and the remainder "0." Here, the phase difference "0" is input to the third oscillation circuit unit 70-3, but this quotient becomes "1" since the quotient output by an oscillation circuit unit 70 is obtained by adding 1 to the normal quotient. In other words, in a normal remainder system, the minimum value of the quotient at each stage is 0, but in the remainder system of the present embodiment, the minimum value of the quotient output at each stage is 1.

The calculating section calculates the phase difference between the signal under measurement and the reference signal based on (i) the product of the resolution and the quotient output by the oscillation circuit unit 70 at each stage and (ii) the remainder output by the final-stage oscillation circuit unit 70. As described above, the calculating section can calculate the phase difference "160" based on the expression 128×3−32×2+8×1−2×4+0. In other words, the measurement apparatus 100 according to the present embodiment can efficiently measure a phase difference "160" between the signal under measurement and the reference signal using a small circuit.

If the maximum number of loops by each stage of oscillation circuit unit 70 is 4, the overall time resolution of the measurement apparatus 100 described in FIG. 10 is "2" and the measurement range is "512." In order to realize the same maximum number of loops, time resolution, and measurement range with the method described in FIG. 4, the measurement range of each oscillation circuit unit 70 would be "8," and so it would be necessary to connect 64 (512/8) oscillation circuit units 70 in parallel. With the method of FIG. 10, however, it is necessary to connect only four oscillation circuit units 70 in cascade, thereby decreasing the circuit size.

The resolution set for each oscillation circuit unit 70 is preferably an integer multiple of the resolution of the final-stage oscillation circuit unit 70, as in the present embodiment. By setting such resolutions, the computation performed by the calculating section can be simplified.

Figure 11:
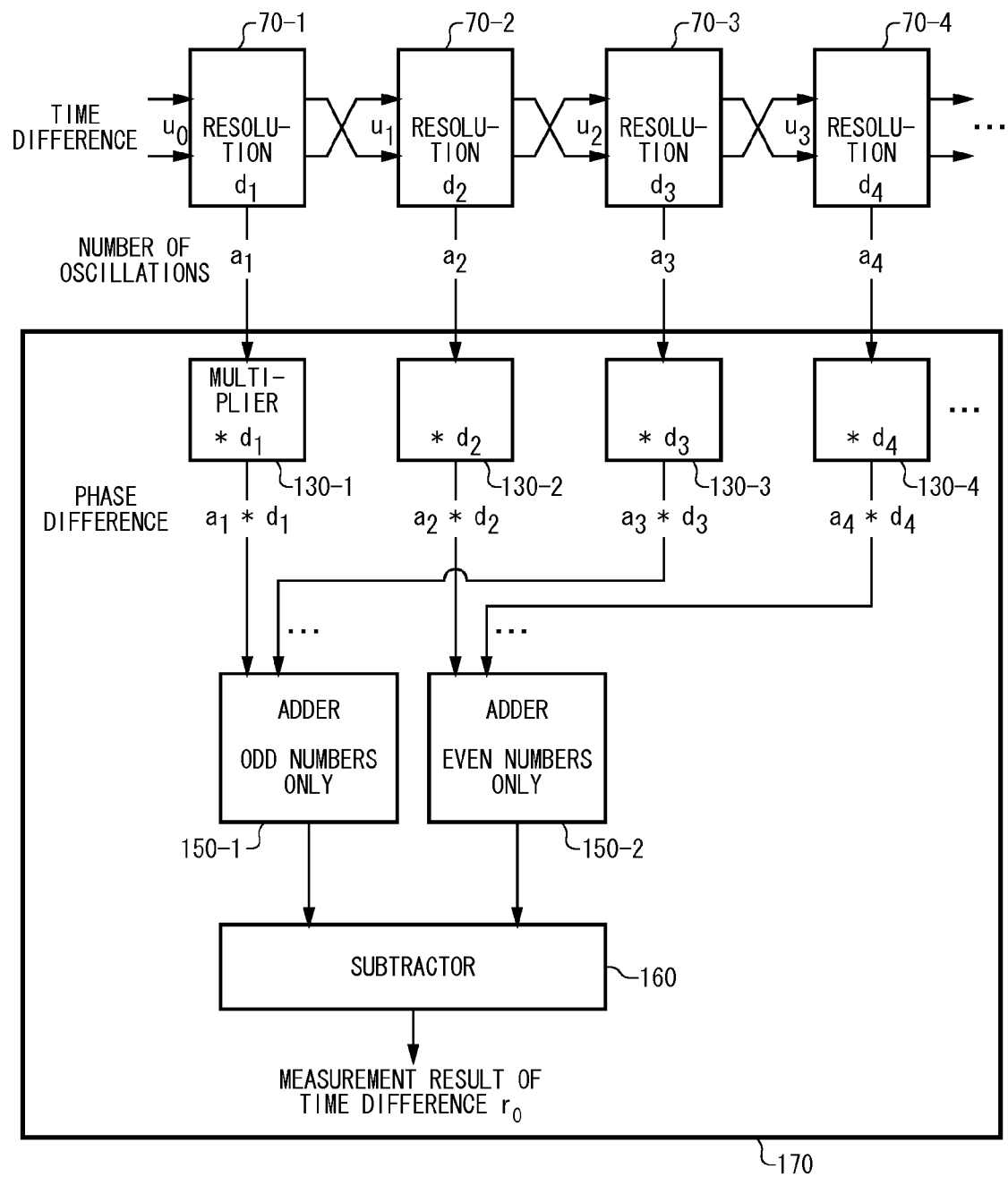
FIG. 11 is a block diagram showing the measurement apparatus 100 described in relation to FIGS. 6 to 10.

FIG. 11 is a block diagram showing the measurement apparatus 100 described in relation to FIGS. 6 to 10. The measurement apparatus 100 includes a plurality of stages of oscillation circuit units 70 and the calculating section 170. As described in FIGS. 9 and 10, each oscillation circuit unit 70 includes a pair of oscillation circuits 10 provided in parallel, a sampling section 30, a changing point detection circuit 34, delay elements 32 connected respectively to the output ends of the oscillation circuits 10, and pulse selection circuits 36 that select pulses to be input to the oscillation circuits 10 at the next stage. The final-stage oscillation circuit unit 70 need not include the delay elements 32 or the pulse selection circuits 36.

The calculating section 170 includes processing sections 130 respectively corresponding to the stages of oscillation circuit units 70, an odd-numbered-stage adder 150-1, an even-numbered-stage adder 150-2, and a subtractor 160. The processing section 130 is the same as the processing section 130 described in FIG. 8. The odd-numbered-stage adder 150-1 calculates the sum of the products of the quotient $a_n$ and the resolution $d_n$ output respectively by the processing sections 130 corresponding to odd-numbered stages. The even-numbered-stage adder 150-2 calculates the sum of the products of the quotient $a_n$ and the resolution $d_n$ output respectively by the processing sections 130 corresponding to even-numbered stages.

The subtractor 160 calculates the phase difference between the signal under measurement and the reference signal by subtracting the sum calculated by the even-numbered-stage adder 150-2 from the sum calculated by the odd-numbered-stage adder 150-1. Here, the remainder of the phase difference output by the final-stage oscillation circuit unit 70 becomes a measurement error, but this measurement error is sufficiently small since the resolution of the oscillation circuit unit 70 is sufficiently high. The calculating section 170 may operate according to a program that causes the calculating section 170 to function as the processing sections 130, the odd-numbered-stage adder 150-1, the even-numbered-stage adder 150-2, and the subtractor 160. For example, the calculating section 170 may be an electronic calculator including this program, and execution of this program may cause the calculating section 170 to function as the processing sections 130, the odd-numbered-stage adder 150-1, the even-numbered-stage adder 150-2, and the subtractor 160. Instead, this program may be stored on a recording medium such as a floppy disk or a CD-ROM.

Figure 12:
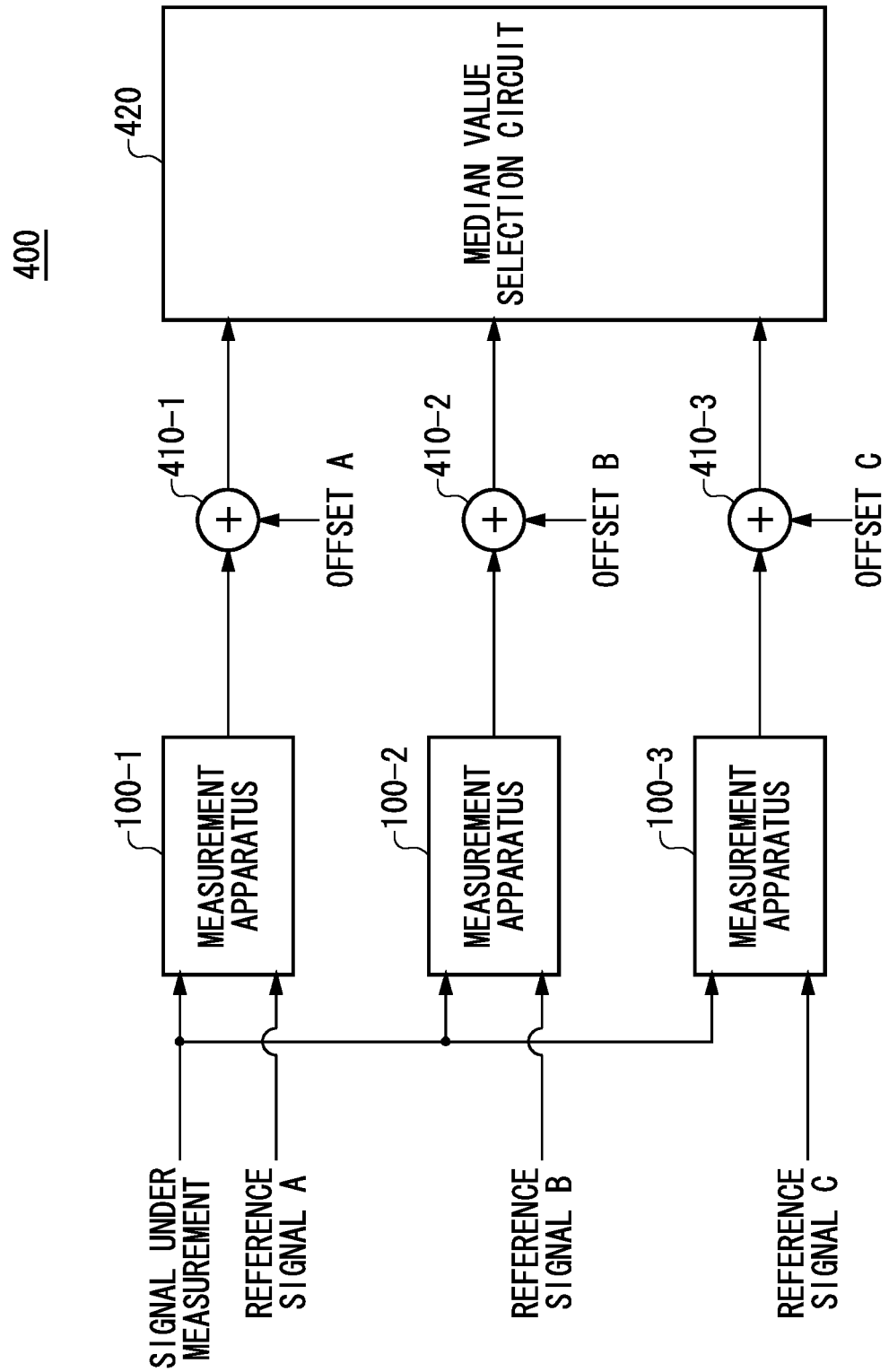
FIG. 12 shows an exemplary configuration of a measurement apparatus 400 that measures the phase difference between the signal under measurement and the reference signal.

FIG. 12 shows an exemplary configuration of a measurement apparatus 400 that measures the phase difference between the signal under measurement and the reference signal. The measurement apparatus 400 of the present embodiment includes three measurement apparatuses 100, three offset addition sections 410, and a median value selection circuit 420. The measurement apparatuses 100 are provided in parallel. Each measurement apparatus 100 is the same as the measurement apparatus 100 described in FIGS. 6 to 11. The oscillation circuit units 70 at corresponding stages in each measurement apparatus 100 are set to have the same resolution. In other words, the measurement apparatuses 100 all have the same settings.

If flip-flops are used as the sampling sections 30 in the measurement apparatus 100 described in FIGS. 6 to 11, the measurement error due to metastability in the sampling sections 30 increases. For example, when the phase difference between the signal under measurement and the clock signal input to a flip-flop is between the setup time and the hold time of the flip-flop, the time needed to confirm the judgment result of the changing point detection circuit 34 increases, and this causes an error in the time of the pulse selected by the pulse selection circuit 36. This error causes measurement errors in oscillation circuit units 70 at later stages. When metastability occurs in sampling sections 30 at earlier stages having lower resolution, this measurement error due to metastability become particularly large. The measurement apparatus 400 of the present embodiment measures the phase of the signal under measurement with increased accuracy by removing the effect of metastability in all sampling sections 30 except the final-stage sampling section 30.

Each measurement apparatus 100 receives a signal under measurement and a reference signal having a different relative phase difference therebetween. For example, as shown in FIG. 12, the same signal under measurement may be branched to each of the measurement apparatuses 100. At this time, the phase of the signal under measurement input to each measurement apparatus 100 is substantially the same. Each measurement apparatus 100 is supplied with a reference signal with a different phase. For example, the reference signal generating section may generate a plurality of reference signals with different phases by delaying, by different delay amounts, a reference signal generated by a timing generator.

As another example, the same reference signal may be branched and input to the measurement apparatuses 100. In this case, the phase of the reference signal input to each measurement apparatus 100 is substantially the same. Each measurement apparatus 100 is supplied with a signal under measurement with a different phase. For example, the measurement apparatuses 100 may be supplied with signals under measurement delayed by different amounts.

As described above, the measurement apparatus 400 may further include delay elements that each delay the signal under measurement or the reference signal by different delay amounts. The delay elements are preferably variable delay circuits whose delay amounts can be set according to the desired phase difference between each pair of a signal under measurement and a reference signal.

The offset addition sections 410 are provided to correspond one-to-one with the measurement apparatuses 100. Each offset addition section 410 subtracts a prescribed offset value from the phase difference between the signal under measurement and the reference signal calculated by the calculating section 170 of the corresponding measurement apparatus 100. Here, the offset values are each set according to the difference in the delay amounts set for the corresponding delay element. In other words, each offset addition section 410 cancels out the offset phase difference applied when the signals are input to the corresponding measurement apparatus 100.

By causing the input signals under measurement or reference signals to have different phases in this way, the measurement apparatus 400 can prevent metastability in a plurality of measurement apparatuses 100. The median value selection circuit 420 selects a median value from among the values output by the offset addition sections 410, and outputs this median value. The "median value" refers to the value that is neither the minimum value nor the maximum value from among the three output values. When the offset addition sections 410 cancel out the offset phase differences at the time of input, the values output by the offset addition sections 410 are substantially the same since metastability does not occur. However, the value output by each offset addition section 410 has an error corresponding to the remainder output by the final-stage oscillation circuit unit 70. This error is less than a unit of resolution of the final-stage oscillation circuit unit 70, and therefore has only a small effect on the measurement accuracy.

Furthermore, even when metastability occurs in one of the measurement apparatuses 100, this does not cause metastability in the other measurement apparatuses 100 because each measurement apparatus 100 receives the signal under measurement and the reference signal with a different relative phase difference therebetween. Since the value output by an offset addition section 410 corresponding to a measurement apparatus 100 in which metastability occurs contains a relatively large error, this value becomes the minimum or maximum value among the three output values. Therefore, by selecting the median value from among the values output by the offset addition sections 410, the measurement result of a measurement apparatus 100 in which metastability does not occur can be selected.

Therefore, the measurement apparatus 400 of the present embodiment can detect the phase difference between the signal under measurement and the reference signal with a measurement error that is less than a unit of resolution of the final-stage oscillation circuit unit 70, regardless of whether there is no metastability or metastability in one of the measurement apparatuses 100.

Setting the offset phase difference applied when the signal under measurement and the reference signal are input can cause metastability in a plurality of measurement apparatuses 100. As an example, an offset phase difference of 0 (reference) is applied to the signal under measurement and the reference signal A input to the first measurement apparatus 100, an offset phase difference of D12 is applied to the signal under measurement and the reference signal B input to the second measurement apparatus 100, and an offset phase difference of D13 is applied to the signal under measurement and the reference signal C input to the third measurement apparatus 100. The difference between the offset phase difference D12 and the offset phase difference D13 is the offset phase difference D23. Each measurement apparatus 100 includes four stages of oscillation circuit units 70, and the resolutions for these oscillation circuit units 70 are respectively "128," "32," "8," and "2."

In this case, when the offset phase difference D12 is "8" for example, if metastability occurs in the first measurement apparatus 100 at a stage other than the final stage, metastability will also occur in the third oscillation circuit unit 70, which has a resolution of "8," of the second measurement apparatus 100. Therefore, the offset phase differences applied when the signal under measurement or the reference signal is input, i.e. the delay amounts of the delay elements, are preferably determined based on the resolution of each oscillation circuit unit 70 and the total setup/hold times of the sampling sections 30.

When the resolution of an oscillation circuit unit 70 not at the final stage, i.e. a resolution of "128," "32," or "8," is an integer multiple of the resolution of the oscillation circuit unit 70 at a stage immediately prior to the final stage, i.e. a resolution of "8," as in the above example, the offset phase difference applied to the signal under measurement or the reference signal at the time of input is preferably set to not be an integer multiple of the resolution of the oscillation circuit unit 70 at a stage immediately prior to the final stage, i.e. a resolution of "8." In other words, the offset phase difference D12, the offset phase difference D13, and the offset phase difference D23 are preferably each set to not be an integer multiple of the resolution of the oscillation circuit unit 70 at a stage immediately prior to the final stage.

Furthermore, when considering the setup/hold times of the sampling sections 30, the offset phase difference D12, the offset phase difference D13, and the offset phase difference D23 are preferably each set to not be within a range obtained by adding and subtracting the total setup/hold time to and from an integer multiple of the resolution of the oscillation circuit unit 70 at a stage immediately prior to the final stage. For example, when the total setup/hold time is "1" and the offset phase difference D12 is set to be "17," this set value is within a range of 15 to 17, calculated by adding and subtracting the total setup/hold time of "1" to and from double the resolution of "8," and therefore there is a chance that metastability will occur in the first measurement apparatus 100 and the second measurement apparatus 100.

On the other hand, when the offset phase difference D12 is set to be "10" and the offset phase difference D13 is set to be "22," the offset phase difference D23 is "12." These offset phase differences are each outside of ranges of 7 to 9, 15 to 17, 23 to 25, etc., calculated by adding and subtracting the total setup/hold time of "1" to and from each integer multiple of the resolution of "8," and therefore metastability is prevented in the plurality of measurement apparatuses 100.

When the resolution at a stage immediately prior to the final stage is not sufficiently larger than the total setup/hold time, there are no suitable value that can be set for the offset phase difference D12, the offset phase difference D13, and the offset phase difference D23. For example, when the resolution at a stage immediately prior to the final stage is "8" and the total setup/hold time is "3," no values exist for the offset phase difference D12, the offset phase difference D13, and the offset phase difference D23 that would be outside of ranges calculated by adding and subtracting the total setup/hold time of "3" to and from each integer multiple of the resolution of "8."

Therefore, the resolution of the oscillation circuit unit 70 at the stage immediately prior to the final stage is preferably set to be a value that is sufficiently larger than the total setup/hold time of the sampling section 30. More specifically, this resolution is preferably larger than three times the total setup/hold time. The offset phase differences are necessary for narrowing the measurement range, and are therefore preferably set to be as small as possible in a range that fulfills the above conditions.

Figure 13:
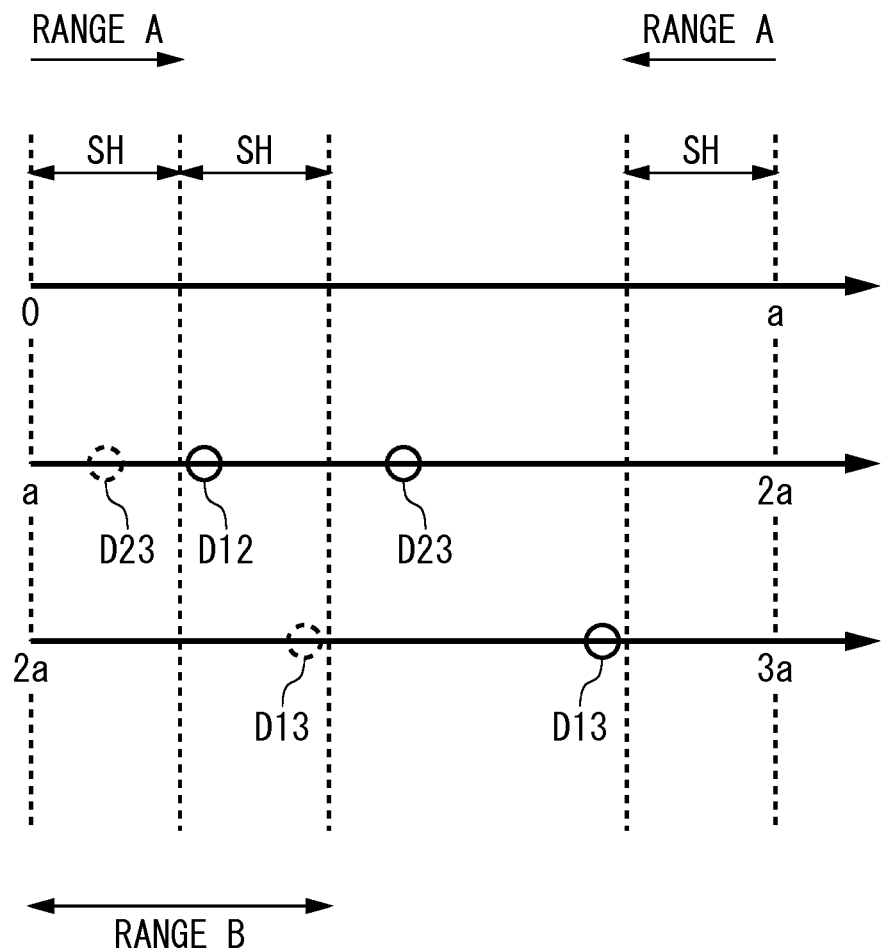
FIG. 13 shows a relationship between the resolution "a" of an oscillation circuit unit 70 at the stage immediately prior to the final stage, the total setup/hold time "SH," and the delay amounts D2 and D3.

FIG. 13 shows a relationship between the resolution "a" of an oscillation circuit unit 70 at the stage immediately prior to the final stage, the total setup/hold time "SH," and the offset phase differences D12, D13, and D23. In FIG. 13, the values for "a," "SH," "D12," D13," and "D23" are represented using a number line. FIG. 13 shows the number line divided as 0 to a, a to 2a, and 2a to 3a.

As described above, the offset phase differences D12, D13, and D23 cannot be set within a range A calculated by adding and subtracting the total setup/hold time "SH" to and from each integer multiple of the resolution "a" of the oscillation circuit unit 70 at the stage immediately prior to the final stage. If one of the offset phase differences is set within the range A, then there is a chance that metastability will occur in the plurality of measurement apparatuses 100. For example, if the offset phase difference D12 is set within the range A, there is a chance that metastability will occur in the first measurement apparatus 100-1 and the second measurement apparatus 100-2. Therefore, in the present embodiment, the offset phase difference D12 is set to be a value that is slightly larger than a+SH.

Furthermore, the offset phase difference D13 cannot be set in a range B calculated by adding and subtracting the total setup/hold time "SH" to and from each value obtained by adding an integer multiple of the resolution "a" to the offset phase difference D12. If the offset phase difference D13 is set within the range B, the offset phase difference D23, which is the difference between the offset phase differences D12 and D13, will be within the range A. If this happens, there is a possibility that metastability will occur in the second measurement apparatus 100-2 and the third measurement apparatus 100-3.

In other words, the condition for preventing metastability in the plurality of measurement apparatuses 100 is that the offset phase difference D13 be set outside of the range A and the range B. The widths of the range A and the range B are minimized when the range A and the range B are each half overlapping with each other, as shown in FIG. 13, and this state occurs when the width is three times the total setup/hold time "SH." In other words, if the resolution "a" of the oscillation circuit unit 70 at the stage immediately prior to the final stage is greater than three times "SH," the offset phase differences D12, D13, and D23 can be set to fulfill the above condition.

Figure 14:
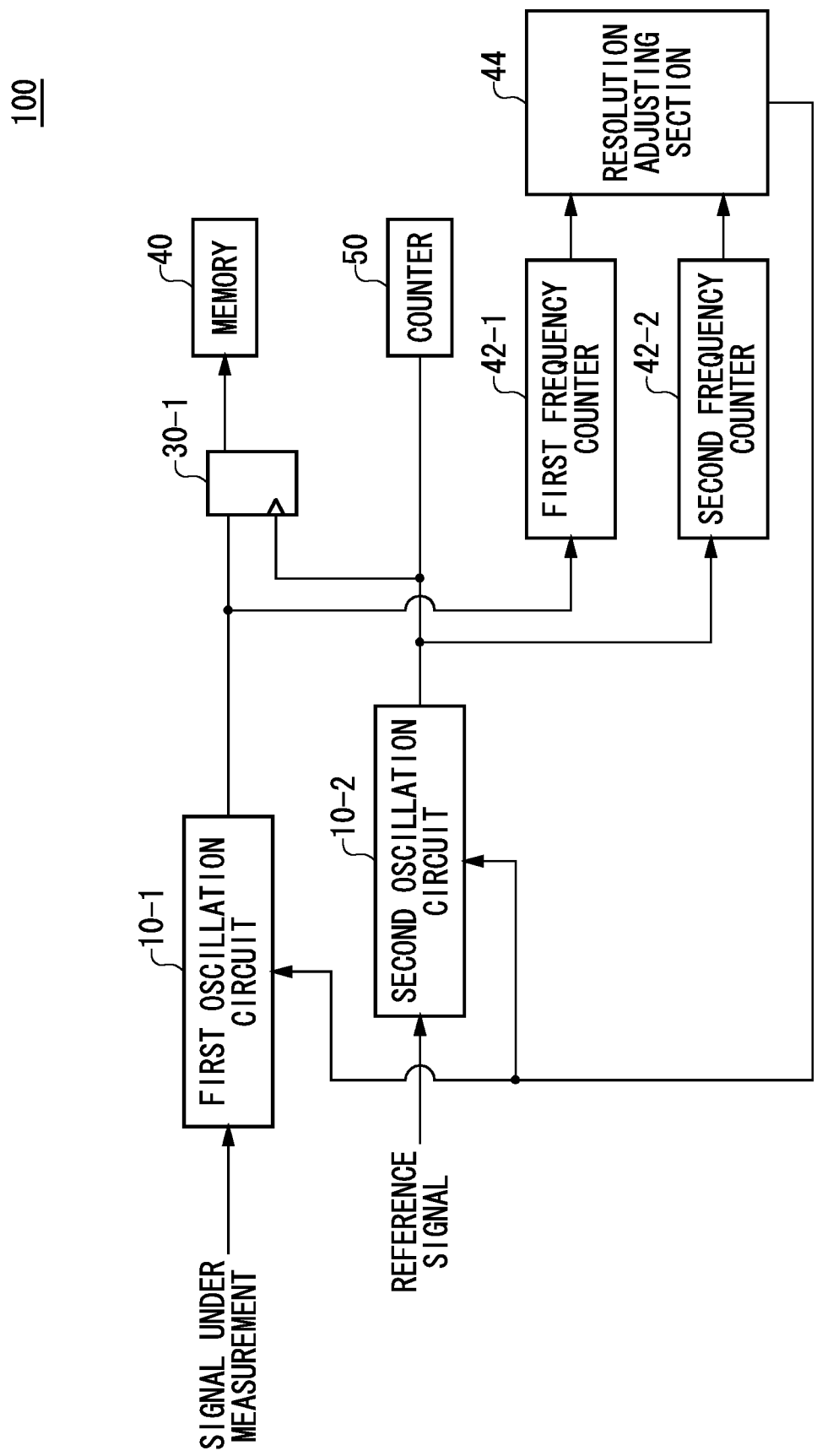
FIG. 14 shows another exemplary configuration of the measurement apparatus 100.

FIG. 14 shows another exemplary configuration of the measurement apparatus 100. The measurement apparatus 100 of the present embodiment further includes a first frequency counter 42-1, a second frequency counter 42-2, and a resolution adjusting section 44 in addition to the configuration of the measurement apparatus 100 described in relation to FIG. 1. The remaining configuration of this measurement apparatus 100 may be the same as that of the measurement apparatus 100 in FIG. 1. The measurement apparatus 100 of the present embodiment adjusts the delay amounts of the first delay section 14-1 and the second delay section 14-2 such that the measurement resolution becomes a prescribed resolution.

The first frequency counter 42-1 counts the number of pulses of the first oscillated signal output by the first oscillation circuit 10-1. The second frequency counter 42-2 counts the number of pulses of the second oscillated signal output by the second oscillation circuit 10-2, simultaneously with the counting by the first frequency counter 42-1

The difference between the delay amounts of the first delay section 14-1 and the second delay section 14-2, i.e. the difference between the oscillation periods of the first oscillation circuit 10-1 and the second oscillation circuit 10-2, corresponds to the measurement resolution. Furthermore, the count value of the first frequency counter 42-1 and the count value of the second frequency counter 42-2 within a prescribed interval correspond to the delay amount of the first delay section 14-1 and the delay amount of the second delay section 14-2. Therefore, the difference between these count values corresponds to the measurement resolution.

The resolution adjusting section 44 adjusts the delay amounts of the first delay section 14-1 and the second delay section 14-2 based on the count value of the first frequency counter 42-1 and the count value of the second frequency counter 42-2 within a prescribed interval. For example, the resolution adjusting section 44 may adjust the delay amounts of the first delay section 14-1 and the second delay section 14-2 such that the difference between the count value of the first frequency counter 42-1 and the count value of the second frequency counter 42-2 becomes a predetermined value corresponding to the measurement resolution to be set.

When the difference between the count values is greater than a predetermined value, for example, the resolution adjusting section 44 may adjust the delay value of at least one of the first delay section 14-1 and the second delay section 14-2 such that the difference between the delay amounts of the first delay section 14-1 and the second delay section 14-2 decreases. When the difference between the count values is less than a predetermined value, for example, the resolution adjusting section 44 may adjust the delay value of at least one of the first delay section 14-1 and the second delay section 14-2 such that the difference between the delay amounts of the first delay section 14-1 and the second delay section 14-2 increases.

The measurement apparatus 100 of the present embodiment measures the delay amounts of the first delay section 14-1 and the second delay section 14-2 simultaneously, and can therefore decrease the error in the difference value between the delay amounts caused by power supply variation, temperature variation, or the like. In other words, the absolute value of the oscillation period of an oscillation circuit 10 fluctuates due to power supply variation, temperature variation, or the like, and is therefore difficult to accurately adjust. However, the measurement apparatus 100 of the present embodiment uses the first frequency counter 42-1 and the second frequency counter 42-2 to measure the oscillation periods simultaneously, and adjusts the difference therebetween. As a result, the measurement apparatus 100 can cancel out the effect of power supply variation, temperature variation, or the like on the two oscillation circuits 10, and can therefore accurately set the measurement resolution.

The resolution adjusting section 44 may adjust the measurement resolution before measurement of the signal under measurement is performed. In this case, the resolution adjusting section 44 may control the first oscillation circuit 10-1 and the second oscillation circuit 10-2 to output the first oscillated signal and the second oscillated signal. The resolution adjusting section 44 may adjust the measurement resolution while measurement of the signal under measurement is being performed.

The first frequency counter 42-1, the second frequency counter 42-2, and the resolution adjusting section 44 may be provided in the same way to the measurement apparatus 100 shown in FIGS. 4 and 6 and the measurement apparatus 400 shown in FIG. 12. In this case, the first frequency counter 42-1, the second frequency counter 42-2, and the resolution adjusting section 44 are provided for each oscillation circuit unit 70.

Figure 15:
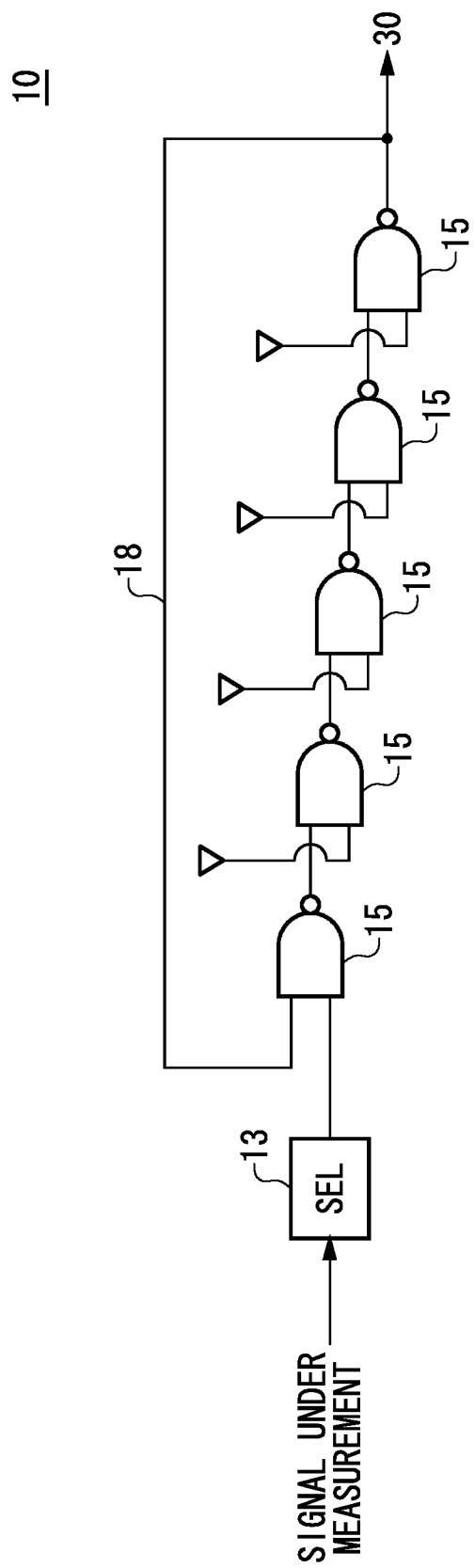
FIG. 15 shows another exemplary configuration of an oscillation circuit 10.

FIG. 15 shows another exemplary configuration of an oscillation circuit 10. The first oscillation circuit 10-1, the second oscillation circuit 10-2, the third oscillation circuit 10-3, the fourth oscillation circuit 10-4, etc. may have the configuration shown in FIG. 15. The oscillation circuit 10 of the present embodiment includes a control section 13, an odd number of AND circuits 15 connected in cascade, and a loop line 18.

The control section 13 selects a pulse to be measured from among the pulses of an input signal such as a signal under measurement. The control section 13 outputs a signal fixed to be logic H in response to a rising edge of the selected pulse. In other words, the output of the control section 13 is fixed at logic L at timings prior to the rising edge and is fixed at logic H at timings after the rising edge. As another example, the control section 13 may output a signal fixed at logic H in response to a falling edge of the selected pulse.

The first-stage AND circuit 15 outputs an inverted AND of the signal output by the selector 12 and the signal output by the final-stage AND circuit 15. Each AND circuit 15 from the second stage onward outputs an inverted AND of the signal output by the AND circuit 15 at the previous stage and logic H. The loop line 18 inputs the signal output by the final-stage AND circuit 15 into the first-stage AND circuit 15.

With this configuration, an oscillated signal can be generated. The control section 13 of the present embodiment corresponds to the control section 16 and the selector 12 of the oscillation circuit 10 in FIG. 1. Furthermore, the AND circuits 15 correspond to the delay sections 14 in FIG. 1. In the present embodiment, the delay amounts of the AND circuits 15 can be adjusted by adjusting the power supply voltage of the AND circuits 15, for example, to adjust the period of the oscillated signal.

The measurement apparatus 100 may include a sampling section 30 for each AND circuit 15. In this case, each sampling section 30 may sample the output of the AND circuit 15 in the corresponding first oscillation circuit 10-1 according to the output of each AND circuit 15 in the second oscillation circuit 10-2. With this configuration, the measurement apparatus 100 can measure the signal under measurement with an even higher measurement resolution.

Figure 16:
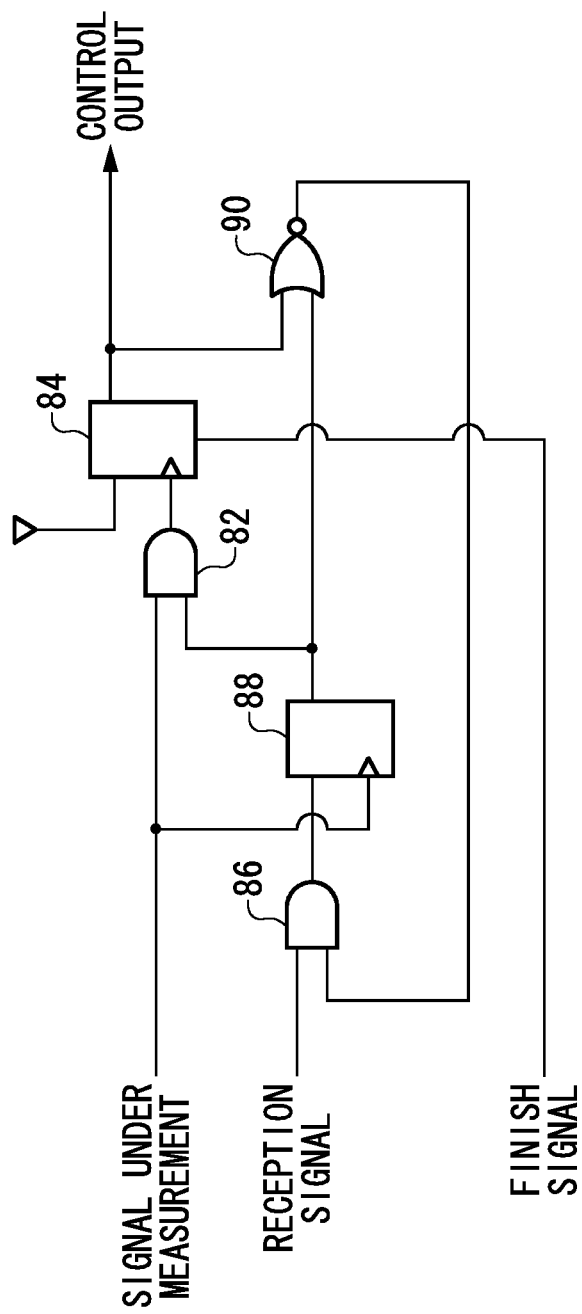
FIG. 16 shows an exemplary configuration of the control section 13 described in FIG. 15.

FIG. 16 shows an exemplary configuration of the control section 13 described in FIG. 15. The control section 13 of the present embodiment outputs a signal fixed at logic H according to a pulse to be measured of the signal under measurement. The pulse to be measured of the signal under measurement is designated by a reception signal. A user, for example, may determine which pulse is to be designated. Furthermore, a finish signal is used to control the timing at which the oscillation of the oscillation circuit 10 stops. For example, the measurement apparatus 100 may supply the control section 13 with the finish signal when the count value obtained by counting the pulses of the oscillated signal reaches a predetermined value.

The control section 13 includes an AND circuit 82, a flip-flop 84, an AND circuit 86, a flip-flop 88, and an OR circuit 90. The AND circuit 82 outputs an AND of the signal under measurement and the reception signal received via the AND circuit 86 and the flip-flop 88. In other words, the AND circuit 82 passes the pulse of the signal under measurement when the received reception signal is logic H.

The flip-flop 84 receives the signal fixed at logic H as the data input, and receives the signal output by the AND circuit 82 as the clock input. In other words, the flip-flop 84 outputs a control signal that is fixed at logic H according to the edge of the selected pulse of the signal under measurement. The flip-flop 84 resets the internal data in response to the finish signal. In other words, the flip-flop 84 outputs the control signal fixed at logic L according to the finish signal. With this configuration, the oscillation circuit 10 can begin oscillating according to the edge to be measured of the signal under measurement.

The AND circuit 86 controls whether the reception signal is passed therethrough. In the present embodiment, the AND circuit 86 outputs an AND of the reception signal and the output of the OR circuit 90. In other words, the AND circuit 86 passes the reception signal when the output of the OR circuit 90 indicates logic H.

The OR circuit 90 controls whether the reception signal is passed to the AND circuit 86. The OR circuit 90 passes the reception signal to the AND circuit 86 on a condition that the oscillation circuit 10 is not generating the oscillated signal and the oscillation circuit 10 is not trying to generate the oscillated signal according to a reception signal received prior to this reception signal. In the present embodiment, the OR circuit 90 supplies the AND circuit 86 with the inverted OR of the output of the flip-flop 84 and the output of the flip-flop 88. The flip-flop 88 receives the output of the AND circuit 86 as the data input and receives the signal under measurement as the clock input.

Figure 17:
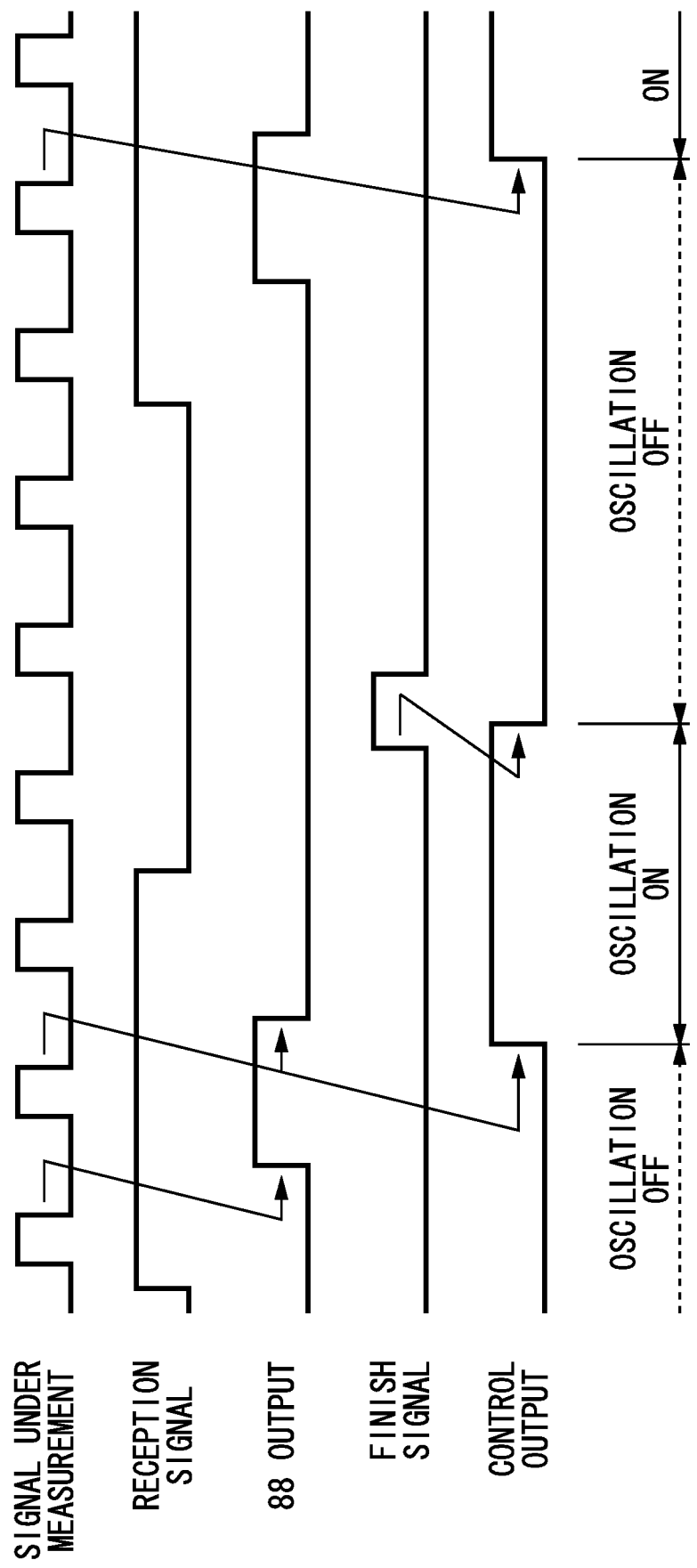
FIG. 17 is a timing chart showing an exemplary operation of the control section 13 shown in FIG. 16.

FIG. 17 is a timing chart showing an exemplary operation of the control section 13 shown in FIG. 16. When the oscillation circuit 10 is not generating the oscillated signal and the oscillation circuit 10 is not trying to generate the oscillated signal according to a reception signal received prior to this reception signal, the OR circuit 90 outputs a logic H signal. Therefore, the AND circuit 86 passes the reception signal.

As shown in FIG. 17, the flip-flop 88 acquires and outputs the reception signal according to the pulse of the signal under measurement. When the output of the flip-flop 88 becomes logic H, the AND circuit 86 does not pass the reception signal, and so the output of the flip-flop 88 transitions to logic L according to the next pulse of the signal under measurement.

Therefore, the AND circuit 82 selects and passes the next pulse from among the pulses of the signal under measurement, and does not pass other pulses. In other words, the flip-flop 84 outputs the control signal to be logic H from the edge of this next pulse to when the finish signal is received.

The oscillation circuit 10 outputs the oscillated signal while the control signal is logic H. As a result of this operation, one pulse of the signal under measurement can be selected and the oscillation circuit 10 can begin oscillating according to this pulse.

Figure 18:
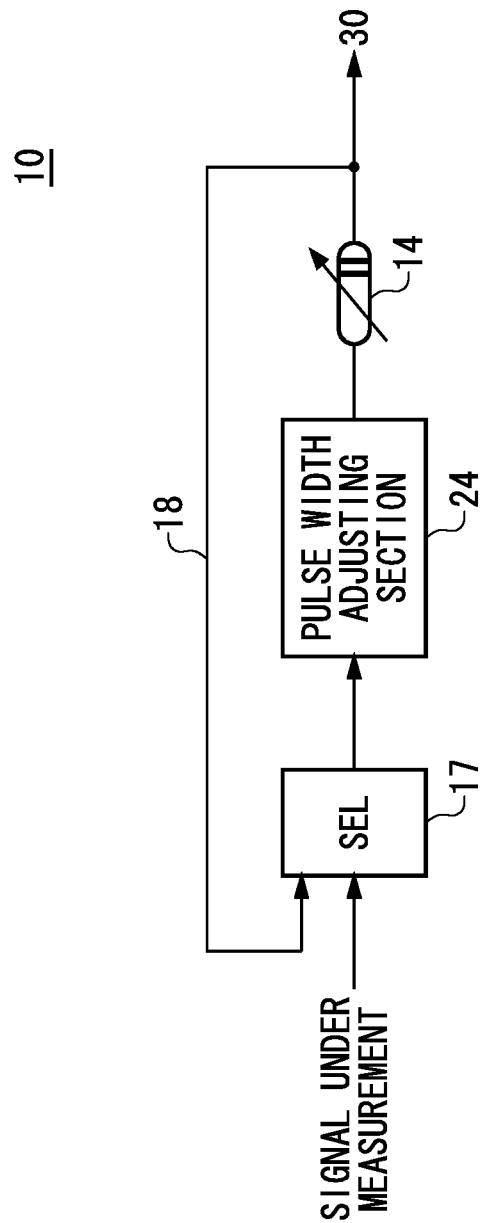
FIG. 18 shows another exemplary configuration of an oscillation circuit 10.

FIG. 18 shows another exemplary configuration of an oscillation circuit 10. For example, the first oscillation circuit 10-1, the second oscillation circuit 10-2, the third oscillation circuit 10-3, the fourth oscillation circuit 10-4, etc. may have the configuration shown in FIG. 18. The oscillation circuit 10 of the present embodiment includes a control section 17, a pulse width adjusting section 24, a delay section 14, and a loop line 18. The delay section 14 may include an odd number of inverters connected in cascade.

The control section 17 selects a pulse to be measured of the signal under measurement, and passes the selected signal to be supplied to the delay section 14 via the pulse width adjusting section 24. The pulse width adjusting section 24 adjusts the pulse width of the received signal and supplies the adjusted signal to the delay section 14. The delay section 14 delays the received signal by a set delay amount and outputs the delayed signal. The loop line 18 inputs to the control section 17 the signal output by the delay section 14. The control section 17 supplies the signal received from the loop line 18 to the delay section 14 via the pulse width adjusting section 24. With this loop, an oscillated signal whose oscillation period is controlled by the delay section 14 can be generated.

Figure 19:
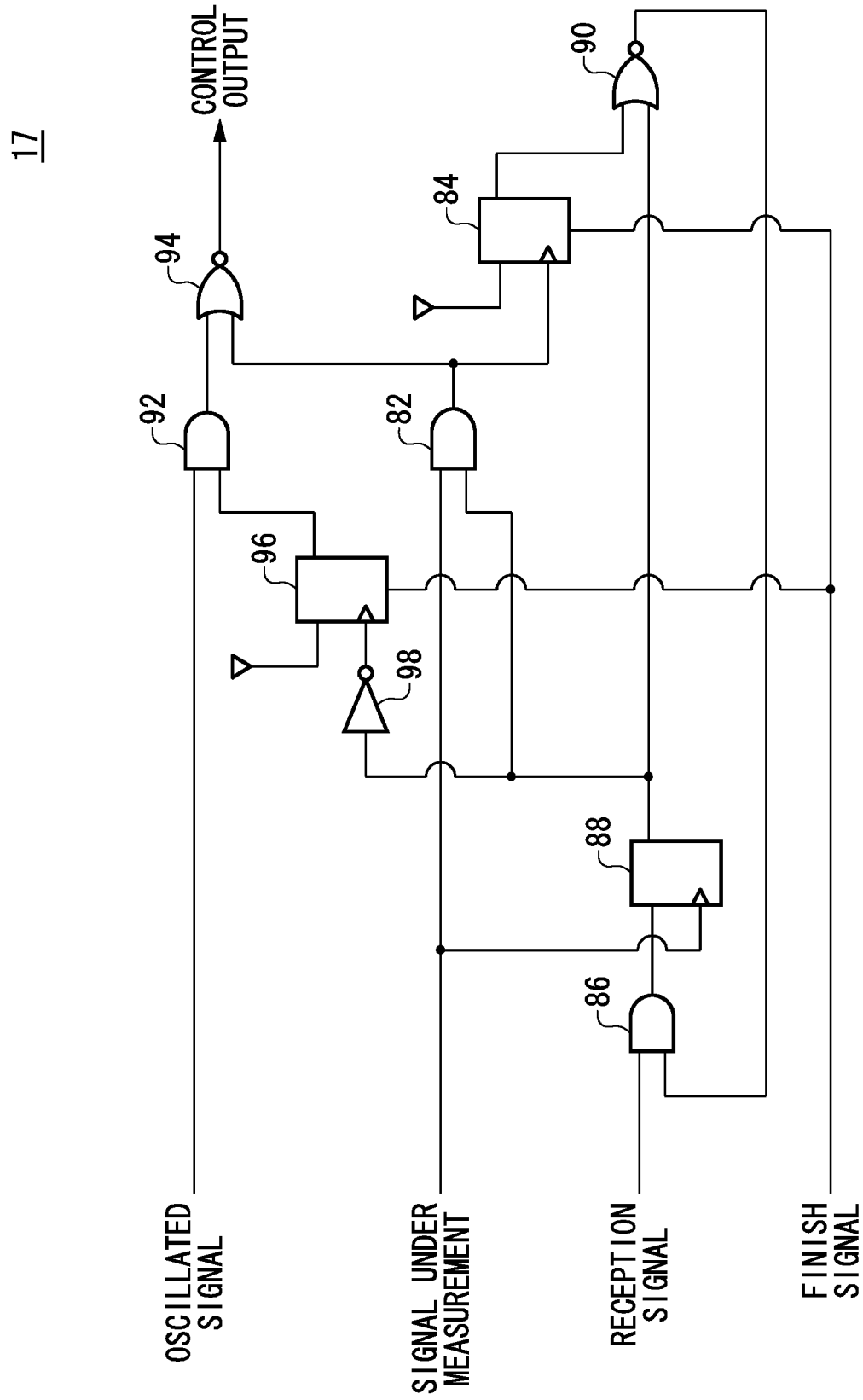
FIG. 19 shows an exemplary configuration of the control section 17.

FIG. 19 shows an exemplary configuration of the control section 17. The control section 17 further includes an AND circuit 92, an OR circuit 94, a flip-flop 96, and an inverter 98 in addition to the configuration of the control section 13 shown in FIG. 16.

Figure 20:
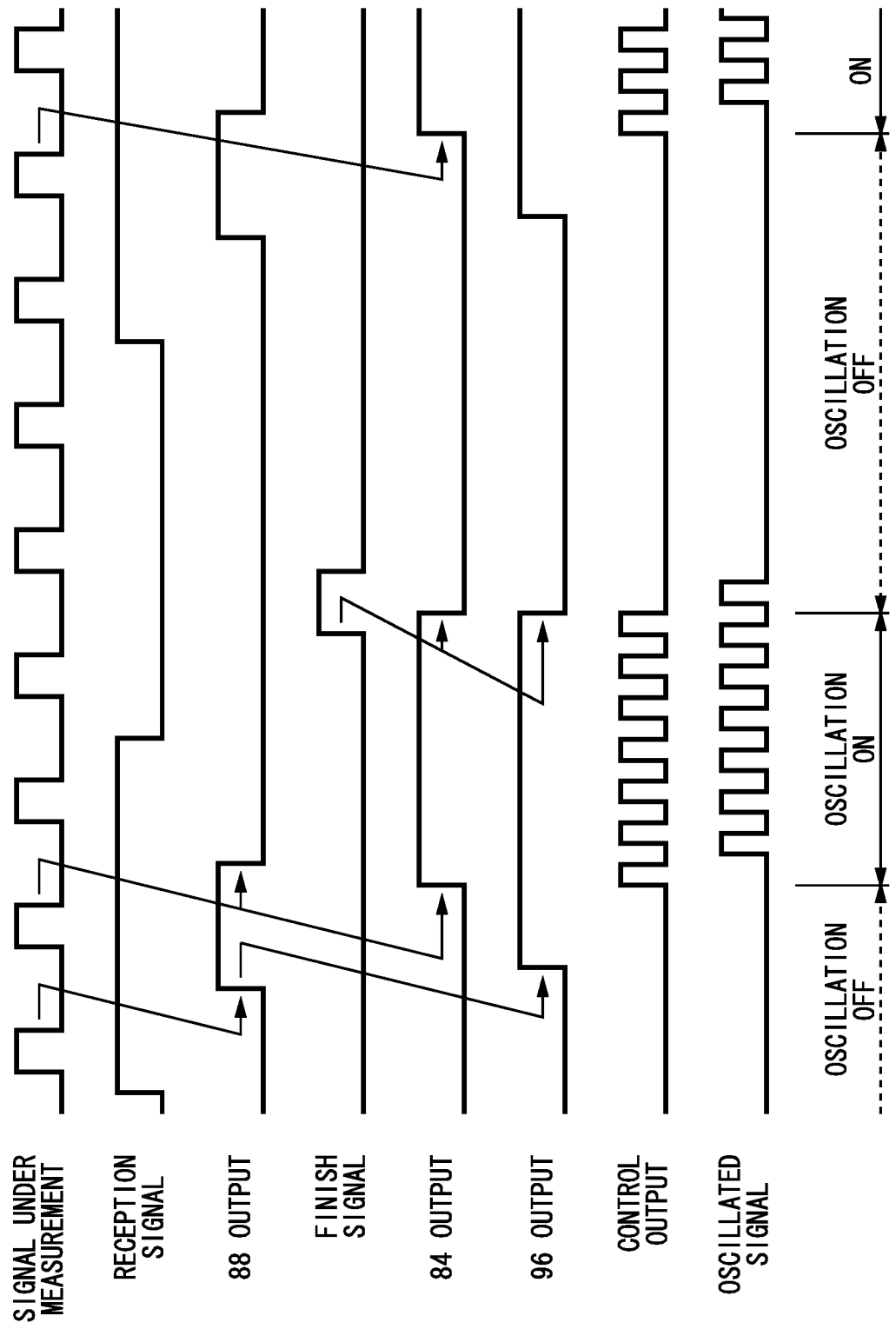
FIG. 20 is a timing chart showing an exemplary operation of the control section 17.

FIG. 20 is a timing chart showing an exemplary operation of the control section 17. The AND circuit 92 receives the oscillated signal output by the oscillation circuit 10 and controls whether the oscillated signal is passed therethrough. In the present embodiment, the AND circuit 92 outputs an AND of the oscillated signal and the output of the flip-flop 96. In other words, the AND circuit 92 passes the oscillated signal when the flip-flop 96 output logic H.

The flip-flop 96 receives a signal fixed at logic H as the data input, and receives the output of the flip-flop 88 as the clock input via the inverter 98. The internal data of the flip-flop 96 is reset according to the finish signal. In other words, the flip-flop 96 outputs logic H from when the flip-flop 88 outputs logic H according to the reception signal to when the reception signal is received, and the logic H output by the flip-flop 96 causes the AND circuit 92 to pass the oscillated signal.

The OR circuit 94 outputs the inverted OR of the output of the AND circuit 92 and the output of the AND circuit 82. In other words, when the AND circuit 82 selects and outputs a pulse of the signal under measurement, the OR circuit 94 passes this pulse. After this, when the signal output by the delay section 14 according to this pulse is output by the AND circuit 92, the OR circuit 94 passes this signal to be fed back as input to the delay section 14. With this configuration, the oscillation circuit 10 can be made to oscillate according to one pulse of the signal under measurement.

In each oscillation circuit 10 described in FIGS. 15 to 20, the reception signal is preferably supplied in synchronization to other oscillation circuits 10. The finish signal is also preferably supplied in synchronization to other oscillation circuits 10. As shown in FIG. 6, when the oscillation circuit units 70 are connected in cascade, the oscillation circuit unit 70 at each stage may receive the reception signal and the finish signal in synchronization at the two oscillation circuits 10.

The finish signal may be logic H when the output of the sampling section 30 transitions.

Figure 21:
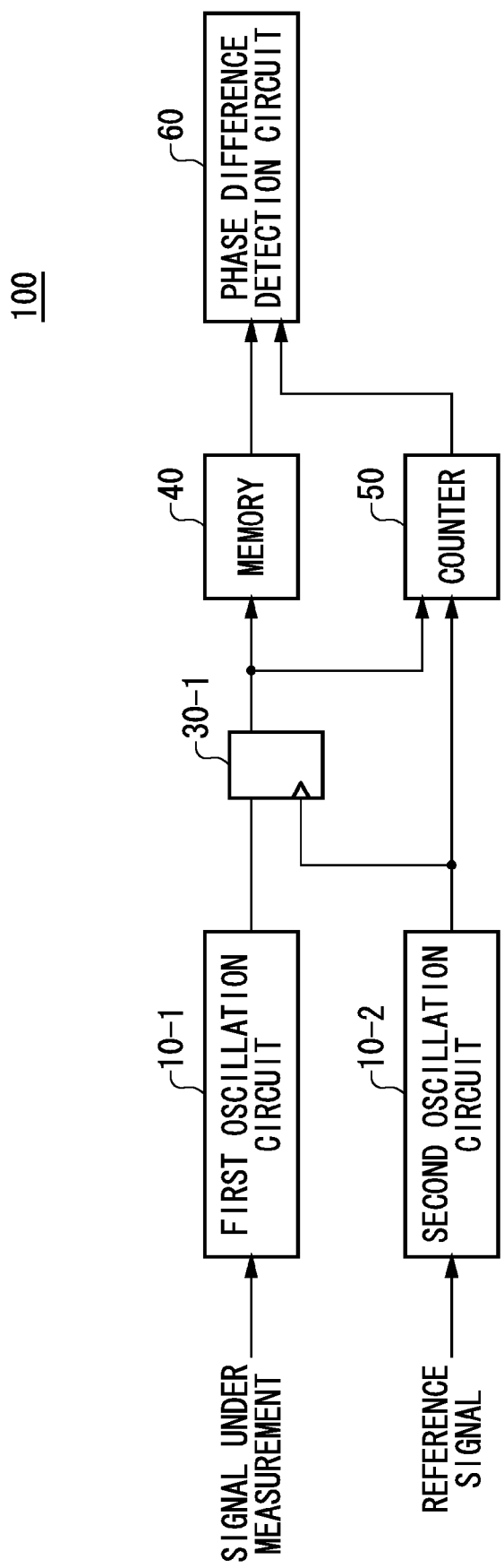
FIG. 21 shows another exemplary configuration of the measurement apparatus 100.

FIG. 21 shows another exemplary configuration of the measurement apparatus 100. The measurement apparatus 100 of the present embodiment further includes a phase difference detection circuit 60 in addition to the configuration of the measurement apparatus 100 described in relation to FIG. 1. The remaining configuration of this measurement apparatus 100 may be the same as that of the measurement apparatus 100 described in relation to FIG. 1.

The phase difference detection circuit 60 detects the phase difference between the signal under measurement and the reference signal based on the sampling results of the first sampling section 30-1. The phase difference detection circuit 60 may detect this phase difference based on the sampling results stored in the memory 40 or on the count results of the counter 50. For example, the phase difference detection circuit 60 may count the number of pulses of the first oscillated signal or the second oscillated signal from when the first oscillation circuit 10-1 and the second oscillation circuit 10-2 begin oscillating to when the logic value of the sampling result of the first sampling section 30-1 transitions. The phase difference detection circuit 60 may detect the phase difference as a product of (i) this count value and (ii) the oscillation period of the first oscillation circuit 10-1, i.e. the first delay amount of the first delay section 14-1, or the oscillation period of the second oscillation circuit 10-2, i.e. the second delay amount of the second delay section 14-2.

When the measurement apparatus 100 has the configuration shown in FIG. 6, the phase difference detection circuit 60 may detect the phase difference based on the sampling results of a plurality of sampling sections 30. When the measurement apparatus 100 has the configuration shown in FIG. 4, the phase difference detection circuit 60 may detect the phase difference between each pulse of the signal under measurement and the corresponding pulse of the reference signal based on the sampling result of the corresponding sampling section 30. In this case, the phase difference detection circuit 60 may calculate the jitter of the signal under measurement based on the phase difference detected for each pulse of the signal under measurement.

Figure 22:
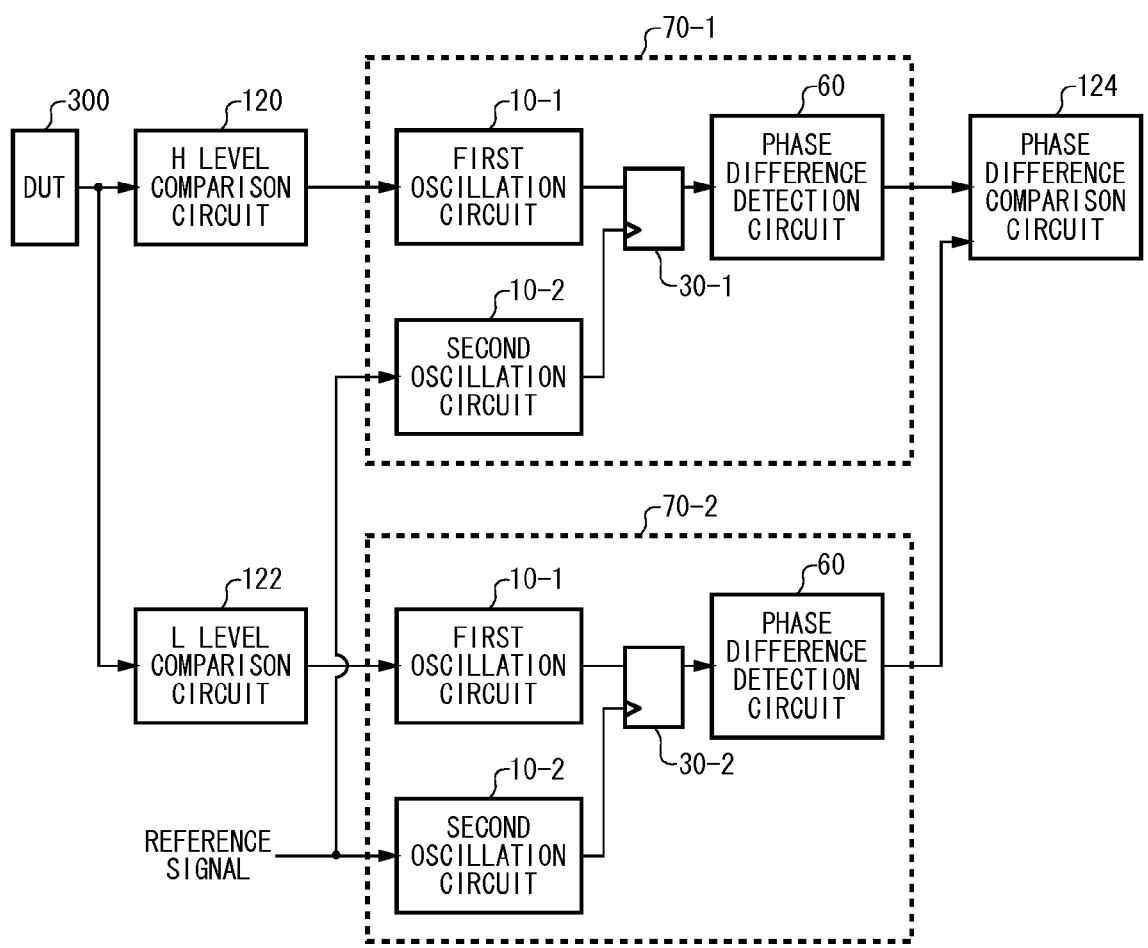
FIG. 22 shows another exemplary configuration of the measurement apparatus 100.

FIG. 22 shows another exemplary configuration of the measurement apparatus 100. The measurement apparatus 100 of the present embodiment measures the rising time and the falling time of a signal under measurement output by a device under test 300. The measurement apparatus 100 includes an H level comparison circuit 120, an L level comparison circuit 122, two oscillation circuit units 70, and a phase difference comparison circuit 124. Each oscillation circuit unit 70 includes a first oscillation circuit 10-2, a second oscillation circuit 10-2, a sampling section 30, and a phase difference detection circuit 60.

The H level comparison circuit 120 and the L level comparison circuit 122 each receive the branched signal under measurement. In other words, the H level comparison circuit 120 and the L level comparison circuit 122 receive the same signal under measurement. The H level comparison circuit 120 compares the signal level of the signal under measurement to a predetermined H-level reference value. For example, the H level comparison circuit 120 may output logic H when the signal level of the signal under measurement is greater than the H-level reference value, and may output logic L when the signal level of the signal under measurement is less than the H-level reference value. In other words, the timing at which the output of the H level comparison circuit 120 transitions from logic L to logic H corresponds to the timing at which the rising edge of the signal under measurement crosses the H-level reference value. Furthermore, the timing at which the output of the H level comparison circuit 120 transitions from logic H to logic L corresponds to the timing at which the falling edge of the signal under measurement crosses the H-level reference value.

The L level comparison circuit 122 compares the signal level of the signal under measurement to a predetermined L-level reference value. The L-level reference value is less than the H-level reference value. The L level comparison circuit 122 may output logic L when the signal level of the signal under measurement is less than the L-level reference value, and may output logic H when the signal level of the signal under measurement is greater than the L-level reference value. In other words, the timing at which the output of the L level comparison circuit 122 transitions from logic L to logic H corresponds to the timing at which the rising edge of the signal under measurement crosses the L-level reference value. Furthermore, the timing at which the output of the L level comparison circuit 122 transitions from logic H to logic L corresponds to the timing at which the falling edge of the signal under measurement crosses the L-level reference value.

The oscillation circuit units 70 correspond respectively to the H level comparison circuit 120 and the L level comparison circuit 122. The first oscillation circuit 10-1 of each oscillation circuit unit 70 begins oscillating according to one pulse of the output of the corresponding comparison circuit to output the first oscillated signal.

The second oscillation circuit 10-2 of each oscillation circuit unit 70 begins oscillating according to one pulse of the reference signal to output the second oscillated signal. Each second oscillation circuit 10-2 outputs the same second oscillated signal, and so a single second oscillation circuit 10-2 may be shared by the H level comparison circuit 120 and the L level comparison circuit 122.

The first sampling section 30-1 of the first oscillation circuit unit 70-1 samples the first oscillated signal output by the first oscillation circuit 10-1 corresponding to the H level comparison circuit 120, according to the second oscillated signal. The second sampling section 30-2 of the second oscillation circuit unit 70-2 samples the first oscillated signal output by the first oscillation circuit 10-2 corresponding to the L level comparison circuit 122, according to the second oscillated signal.

The phase difference detection circuit 60 of the first oscillation circuit unit 70-1 detects the timing at which the logic value output by the first sampling section 30-1 transitions. The phase difference detection circuit 60 of the second oscillation circuit unit 70-2 detects the timing at which the logic value output by the second sampling section 30-2 transitions.

The phase difference comparison circuit 124 calculates the rising time or the falling time of the signal under measurement based on the difference between the timings detected by the two phase difference detection circuits 60. For example, when each phase difference detection circuit 60 detects the timing at which the output of the sampling section 30 transitions from logic L to logic H, the difference between these timings corresponds to the rising time of the signal under measurement. When each phase difference detection circuit 60 detects the timing at which the output of the sampling section 30 transitions from logic H to logic L, the difference between these timings corresponds to the falling time of the signal under measurement.

Here, the rising time of the signal under measurement is the time from when the rising edge of the signal under measurement crosses the L-level reference value to when the rising edge crosses the H-level reference level. The falling time of the signal under measurement is the time from when the falling edge of the signal under measurement crosses the H-level reference value to when the falling edge crosses the L-level reference level. The H-level reference value and the L-level reference value may be determined according to the specifications of the device under test 300.

Figure 23:
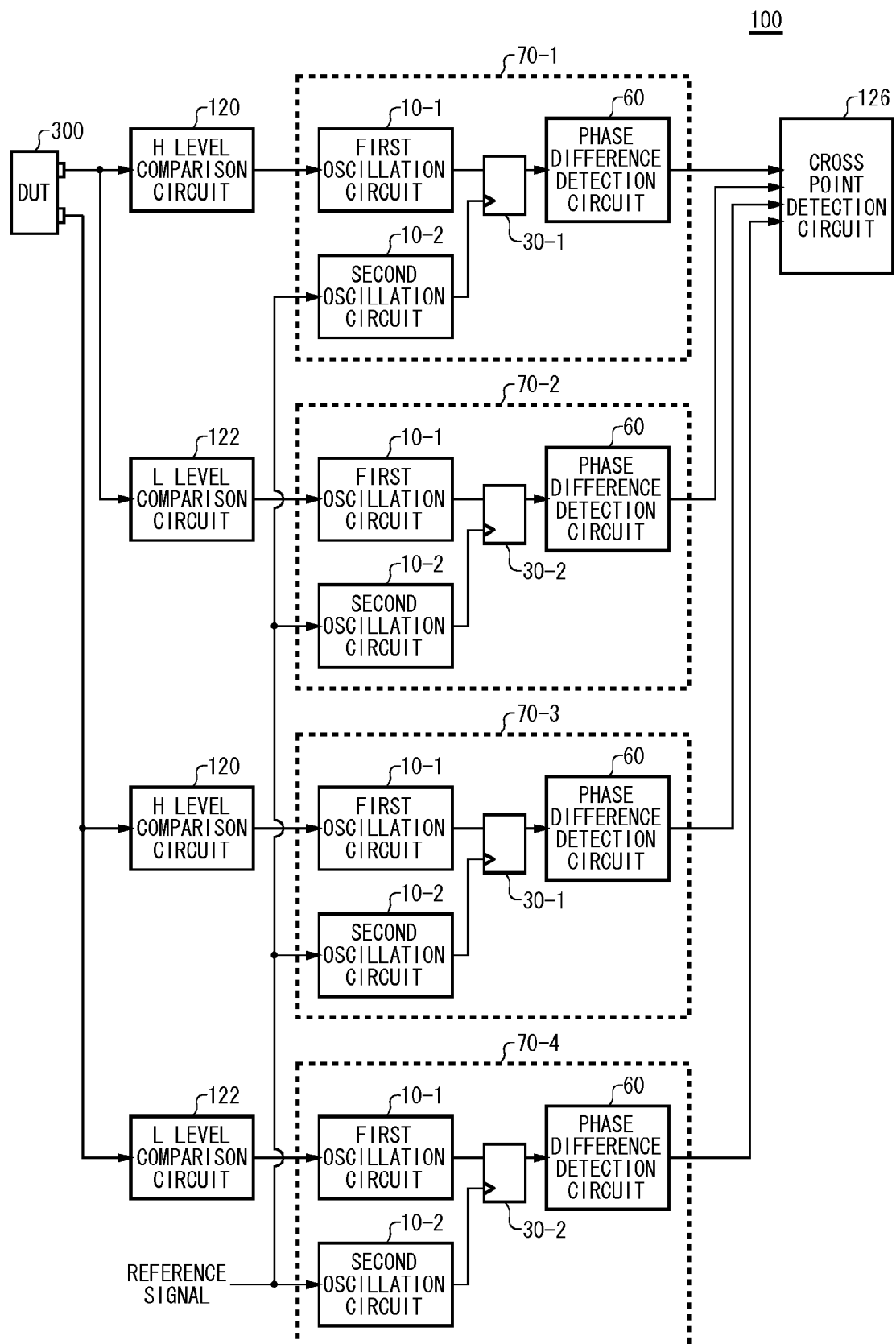
FIG. 23 shows another exemplary configuration of the measurement apparatus 100.

FIG. 23 shows another exemplary configuration of the measurement apparatus 100. The measurement apparatus 100 of the present embodiment detects the cross point timing of a differential signal output by a device under test 300. The measurement apparatus 100 of the present embodiment receives a first signal under measurement and a second signal under measurement output by the device under test 300. The first signal under measurement and the second signal under measurement are a differential signal. As shown in FIG. 23, the measurement apparatus 100 may include two of the oscillation circuit unit 70 pairs described in FIG. 22 corresponding respectively to the first signal under measurement and a second signal under measurement.

The four phase difference detection circuits 60 detect two timings at which the rising edge of the first signal under measurement respectively crosses the L-level reference value and the H-level reference value, and two timings at which the falling edge of the second signal under measurement respectively crosses the H-level reference value and the L-level reference value, for example. The cross point detection circuit 126 obtains an expression representing the line of the rising edge and an expression representing the line of the falling edge from these four points, and calculates the cross point timing at which these rising edge intersects with the falling edge.

The measurement apparatus 100 of the present embodiment includes four second oscillation circuits 10-2 corresponding respectively to the first oscillation circuits 10-1, but since these second oscillation circuits 10-2 all output the same second oscillated signal, the measurement apparatus 100 may instead have a single shared second oscillation circuit 10-2. In this case, the second oscillation circuit 10-2 supplies the branched second oscillated signal to each of the first oscillation circuits 10-1.

The H-level reference values supplied to the H level comparison circuits 120 are preferably the same as each other. The L-level reference values supplied to the L level comparison circuits 122 are also preferably the same as each other. The delay amounts set in the first delay sections 14-1 of the first oscillation circuits 10-1 are preferably the same.

Figure 24:
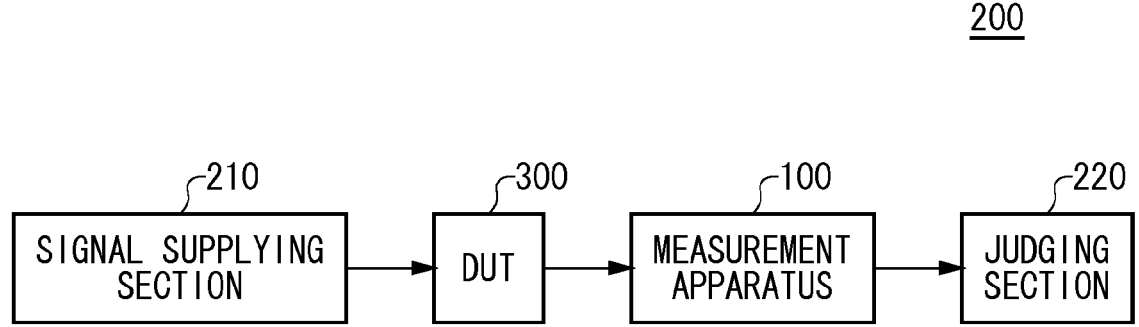
FIG. 24 shows an exemplary configuration of a test apparatus 200 according to an embodiment of the present invention.

FIG. 24 shows an exemplary configuration of a test apparatus 200 according to an embodiment of the present invention. The test apparatus 200 tests a device under test 300 such as a semiconductor, and includes a signal supplying section 210, the measurement apparatus 100, and a judging section 220. The test apparatus 200 may include the measurement apparatus 400 described in relation to FIG. 12 instead of the measurement apparatus 100.

The signal supplying section 210 supplies a test signal to the device under test 300. For example, the signal supplying section 210 may supply a test signal having a prescribed test pattern that causes a logic circuit of the device under test 300 to operate. The device under test 300 outputs a signal under measurement in response to the test signal.

The measurement apparatus 100 measures the signal under measurement output by the device under test 300. The measurement apparatus 100 may be any one of the measurement apparatuses 100 described in FIGS. 1 to 23. For example, the measurement apparatus 100 may measure the transition point timing, the rising edge time, the falling edge time, the cross points, or the jitter of the signal under measurement as described above.

The judging section 220 judges acceptability of the device under test 300 based on the measurement result of the measurement apparatus 100. For example, the judging section 220 may judge acceptability of the device under test 300 based on whether the transition point timing, the rising edge time, the falling edge time, the cross points, or the jitter measured by the measurement apparatus 100 fulfills the specifications needed for the device under test 300. Information concerning the specifications needed for the device under test 300 may be supplied in advance to the judging section 220.

As described above, the measurement apparatus 100 can measure a high-frequency signal under measurement over a wide measurement range with high resolution and low measurement error. Therefore, the test apparatus 200 can accurately test the device under test 300. Furthermore, the measurement apparatus 100 can have a decreased circuit size, and therefore the circuit size of the test apparatus 200 can be decreased.

If the device under test 300 outputs a data signal (DQ) and a strobe signal (DQS) in synchronization with the data signal, the measurement apparatus 100 may receive the data signal (DQ) as the signal under measurement and receive the strobe signal (DQS) as the reference signal. As a result, the measurement apparatus 100 can detect the phase difference between the data signal (DQ) and the strobe signal (DQS).

The measurement apparatus 100 may be provided within an electronic device. For example, the electronic device may include the measurement apparatus 100 described above and an operational signal that outputs a data signal (DQ) and a strobe signal (DQS). The electronic device may further include a diagnostic section that self-diagnoses whether the operational circuit is operating correctly, based on the measurement result of the measurement apparatus 100. For example, the diagnostic section may detect whether the operational circuit is operating correctly based on whether the phase difference between the data signal and the strobe signal is within a prescribed range. If it is judged that the operational circuit is not operating correctly, the diagnostic section may provide notification concerning this judgment to a section outside of the electronic device.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A measurement apparatus that measures a signal under measurement, comprising:
 a first oscillation circuit that receives one pulse of the signal under measurement and begins oscillating according to the pulse of the signal under measurement to output a first oscillated signal:
 a second oscillation circuit that receives one pulse of a reference signal and begins oscillating according to the pulse of the reference signal to output a second oscillated signal having a period that is different from a period of the first oscillated signal; and
 a first sampling section that samples the first oscillated signal according to a pulse of the second oscillated signal, wherein
 the first oscillation circuit includes:
  a first control section that selects one pulse of the signal under measurement;
  a first delay section that delays, by a first delay amount, the pulse selected by the first control section; and
  a first loop line that feeds the pulse output by the first delay section back to an input terminal of the first delay section,
 the second oscillation circuit includes:
  a second control section that selects one pulse of the reference signal;
  a second delay section that delay's, by a second delay amount different from the first delay amount, the pulse selected by the second control section; and
  a second loop line that feeds the pulse output by the second delay section back to an input terminal of the second delay section, and
 the first control section or the second control section counts a number of pulses that pass through the first loop line or the second loop line, respectively, and, when the resulting count value reaches a predetermined value, stops the output of the first oscillated signal or the second oscillated signal, respectively.

2. The measurement apparatus according to claim 1, wherein
 the first oscillation circuit further includes a first selector that receives the pulse of the signal under measurement selected by the first control section at a first input terminal thereof, receives the pulse output by the first delay section at a second input terminal thereof via the first loop line, and, after causing the pulse input to the first input terminal thereof to pass through to the first delay section, causes the pulse input to the second input terminal thereof to pass through to the first delay section, and
 the second oscillation circuit further includes a second selector that receives the pulse of the reference signal selected by the second control section at a first input terminal thereof, receives the pulse output by the second delay section at a second input terminal thereof via the second loop line, and, after causing the pulse input to the first input terminal thereof to pass through to the second delay section, causes the pulse input to the second input terminal thereof to pass through to the second delay section.

3. The measurement apparatus according to claim 1, further comprising a phase difference detection circuit that detects a phase difference between the signal under measurement and the reference signal based on the sampling result obtained by the first sampling section.

4. The measurement apparatus according to claim 3, wherein
 the phase difference detection circuit counts a number of pulses of the first oscillated signal or the second oscillated signal from when the first oscillation circuit and the second oscillation circuit begin oscillating to when a logic value of the sampling result obtained by the first sampling section transitions, and detects the phase difference based on the resulting count value.

5. The measurement apparatus according to claim 1, further comprising:
 a first frequency counter that counts a number of pulses of the first oscillated signal;
 a second frequency counter that counts a number of pulses of the second oscillated signal, simultaneously with the counting by the first frequency counter; and
 a resolution adjusting section that adjusts the delay amounts of the first delay section and the second delay section such that a difference between the count value of the first frequency counter and the count value of the second frequency counter within a predetermined period becomes a predetermined value.

6. A test apparatus that tests a device under test, comprising:
 the measurement apparatus according to claim 1 that measures a signal under measurement output by the device under test; and
 a judging section that judges acceptability of the device under test based on the measurement result of the measurement apparatus.

7. The test apparatus according to claim 6, wherein
 the first oscillation circuit receives, as the signal under measurement, a data signal output by the device under test,
 the second oscillation circuit receives, as the reference signal, a strobe signal output by the device under test in synchronization with the data signal, and
 the measurement apparatus measures a phase difference between the data signal and the strobe signal.

8. An electronic device comprising:
 an operational circuit that outputs a signal under measurement; and
 the measurement apparatus according to claim 1 that measures the signal under measurement.

9. A measurement apparatus that measures a signal under measurement, comprising:
 a first oscillation circuit that receives one pulse of the signal under measurement and begins oscillating according to the pulse of the signal under measurement to output a first oscillated signal:
 a second oscillation circuit that receives one pulse of a reference signal and begins oscillating according to the pulse of the reference signal to output a second oscillated signal having a period that is different from a period of the first oscillated signal;
 a first sampling section that samples the first oscillated signal according to a pulse of the second oscillated signal;
 a third oscillation circuit that receives a pulse of the signal under measurement that is subsequent to the pulse input to the first oscillation circuit, and begins oscillating according to the received pulse of the signal under measurement to output a third oscillated signal;
 a fourth oscillation circuit that receives a pulse of the reference signal that is subsequent to the pulse input to the second oscillation circuit, and begins oscillating according to the received pulse of the reference signal to output a fourth oscillated signal having a period that is different from a period of the third oscillated signal; and a second sampling section that samples the third oscillated signal according to a pulse of the fourth oscillated signal.

10. The measurement apparatus according to claim 9, wherein
the third oscillation circuit outputs the third oscillated signal to have a period that is substantially equal to a period of the first oscillated signal, and
the fourth oscillation circuit outputs the fourth oscillated signal to have a period that is substantially equal to a period of the second oscillated signal.

11. The measurement apparatus according to claim 9, further comprising a reference signal generating section that generates the reference signal to have a period substantially equal to a period of the signal under measurement and supplies the generated reference signal to the second oscillation circuit and the fourth oscillation circuit.

12. A measurement apparatus that measures a signal under measurement, comprising:
a first oscillation circuit that receives one pulse of the signal under measurement and begins oscillating according to the pulse of the signal under measurement to output a first oscillated signal;
a second oscillation circuit that receives one pulse of a reference signal and begins oscillating according to the pulse of the reference signal to output a second oscillated signal having a period that is different from a period of the first oscillated signal;
a first sampling section that samples the first oscillated signal according to a pulse of the second oscillated signal
a third oscillation circuit that receives one pulse of the first oscillated signal and begins oscillating according to the pulse of the first oscillated signal to output a third oscillated signal;
a fourth oscillation circuit that receives one pulse of the second oscillated signal and begins oscillating according to the pulse of the second oscillated signal to output a fourth oscillated signal; and
a second sampling section that samples the third oscillated signal according to a pulse of the fourth oscillated signal.

13. The measurement apparatus according to claim 12, wherein
oscillation periods of the first oscillation circuit, the second oscillation circuit, the third oscillation circuit, and the fourth oscillation circuit are set such that an absolute value of a second subtraction value, which is obtained by subtracting the oscillation period of the fourth oscillation circuit from the oscillation period of the third oscillation circuit, is less than an absolute value of a first subtraction value, which is obtained by subtracting the oscillation period of the second oscillation circuit from the oscillation period of the first oscillation circuit.

14. The measurement apparatus according to claim 13, wherein
the oscillation periods are set such that the sign of the first subtraction value differs from the sign of the second subtraction value.

15. The measurement apparatus according to claim 14, wherein
the first sampling section detects a timing at which a logic value of the first oscillated signal transitions, and
the first oscillation circuit and the second oscillation circuit cause relative phases of the pulse of the first oscillated signal and the pulse of the second oscillated signal to remain the same as when the first sampling section detects that the logic value of the first oscillated signal transitions, and input the pulses having these relative phases into the third oscillation circuit and the fourth oscillation circuit.

16. The measurement apparatus according to claim 15, further comprising:
a second sampling section that samples the third oscillated signal according to a pulse of the fourth oscillated signal;
a first phase difference detection circuit that detects a phase difference between the signal under measurement and the reference signal based on the sampling result obtained by the first sampling section;
a second phase difference detection circuit that detects a phase difference between the first oscillated signal and the second oscillated signal based on the sampling result obtained by the second sampling section; and
a calculating section that subtracts the phase difference detected by the second phase difference detection circuit from the phase difference detected by the first phase difference detection circuit.

17. A parallel measurement apparatus that measures a signal under measurement, comprising:
three of the measurement apparatuses according to claim 14 that are arranged in parallel and that each receive a reference signal or the signal under measurement with a different phase;
three offset addition sections that are provided to correspond one-to-one with the measurement apparatuses and that each subtract an offset value corresponding to the phase of the received reference signal or signal under measurement from a phase of the signal under measurement measured by the corresponding measurement apparatus; and
a median value selection circuit that selects a. median value, from among values output by the offset addition sections, to be the phase of the signal under measurement.

18. A test apparatus that tests a device under test, comprising:
the parallel measurement apparatus according to claim 17 that measures a signal under measurement output by the device under test; and
a judging section that judges acceptability of the device under test based on the measurement result of the parallel measurement apparatus.

19. An electronic device comprising:
an operational circuit that outputs a signal under measurement; and
the parallel measurement apparatus according to claim 17 that measures the signal under measurement.

20. A measurement apparatus that measures a signal under measurement, the measurement apparatus comprising:
a first oscillation circuit unit; and
a second oscillation circuit unit connected in cascade with the first oscillation circuit unit, wherein
the first oscillation circuit unit and the second oscillation circuit unit each include:
a first oscillation circuit that begins oscillating according to a pulse input thereto to output a first oscillated signal;
a second oscillation circuit that begins oscillating according to a pulse input thereto to output a second oscillated signal having a period that is different from a period of the first oscillated signal; and
a sampling section that samples the first oscillated signal according to a pulse of the second oscillated signal, the first oscillation circuit of the first oscillation circuit unit receives one pulse of the signal under measurement, the second oscillation circuit of the first oscillation circuit unit receives one pulse of a reference signal, the first oscillation circuit of the second oscillation circuit unit receives one pulse of the first oscillated signal output by the first oscillation circuit unit, and the second oscillation circuit of the second oscillation circuit unit receives one pulse of the second oscillated signal output by the first oscillation circuit unit.

21. The measurement apparatus according to claim 20, wherein oscillation periods of the first oscillation circuits and the second oscillation circuits are set such that an absolute value of a difference between the oscillation period of the first oscillation circuit and the oscillation period of the second oscillation circuit in the second oscillation circuit unit is less than in the first oscillation circuit unit.

22. The measurement apparatus according to claim 21, wherein the oscillation periods are set such that a positive/negative sign of a value obtained by subtracting the oscillation period of the second oscillation circuit from the oscillation period of the first oscillation circuit in the first oscillation circuit unit is different from a positive/negative sign of a value obtained by subtracting the oscillation period of the second oscillation circuit from the oscillation period of the first oscillation circuit in the second oscillation circuit unit.

23. The measurement apparatus according to claim 22, wherein in the first oscillation circuit unit, (i) the sampling section detects a timing at which a logic value of the first oscillated signal transitions and (ii) the first oscillation circuit and the second oscillation circuit cause relative phases of the pulse of the first oscillated signal and the pulse of the second oscillated signal to remain the same as when the sampling section detects that the logic value of the first oscillated signal transitions, and input the pulses having these relative phases into the second oscillation circuit unit.

24. The measurement apparatus according to claim 23, wherein the first oscillation circuit unit and the second oscillation circuit unit are a first and a second of a plurality of oscillation circuit units connected in cascade and arranged in stages, the measurement apparatus comprises the plurality of oscillation circuit units, and each of the plurality of oscillation circuit units includes a first oscillation circuit that begins oscillating according to a pulse input thereto to output a first oscillated signal, a second oscillation circuit that begins oscillating according to a pulse input thereto to output a second oscillated signal having a period that is different from a period of the first oscillated signal, and a sampling section that samples the first oscillated signal according to a pulse of the second oscillated signal, the measurement apparatus further comprising:

a phase difference detection circuit that detects a phase difference between pulses input to each oscillation circuit unit based on the sampling result of the corresponding sampling section;

an adder that calculates a sum of the phase differences detected for the oscillation circuit units at odd-numbered stages and a sum of the phase differences detected for the oscillation circuit units at even-numbered stages; and a subtractor that subtracts the sum of phase differences at the even-numbered stages from the sum of the phase differences at the odd-numbered stages.

25. The measurement apparatus according to claim 24, wherein the phase difference detection circuit calculates a phase difference at a timing at which the corresponding sampling section detects a transition of the logic value of the first oscillated signal, based on a product of (i) a number of oscillations of the corresponding oscillation circuit unit and (ii)a difference between the oscillation period of the corresponding first oscillation circuit and the oscillation period of the corresponding second oscillation circuit.

26. A measurement apparatus that measures a signal under measurement, the measurement apparatus comprising:

a first oscillation circuit unit; and a second oscillation circuit unit connected in parallel with the first oscillation circuit unit, wherein the first oscillation circuit unit and the second oscillation circuit unit each include:

a first oscillation circuit that begins oscillating according to a pulse of the signal under measurement input thereto to output a first oscillated signal;

a second oscillation circuit that begins oscillating according to a pulse of a reference signal input thereto to output a second oscillated signal having a period that is different from a period of the first oscillated signal; and a sampling section that samples the first oscillated signal according to a pulse of the second oscillated signal, the first oscillation circuit of the first oscillation circuit unit and the first oscillation circuit of the second oscillation circuit unit receive different pulses of the signal under measurement, the second oscillation circuit of the first oscillation circuit unit receives a pulse, from among the pulses of the reference signal, that corresponds to a pulse of the signal under measurement input to the first oscillation circuit of the first oscillation circuit unit, and the second oscillation circuit of the second oscillation circuit unit receives a pulse, from among the pulses of the reference signals, that corresponds to a pulse of the signal under measurement input to the first oscillation circuit of the second oscillation circuit unit.

27. The measurement apparatus according to claim 26, wherein the first oscillation circuit of the first oscillation circuit unit and the first oscillation circuit of the second oscillation circuit unit output the first oscillated signal with the same period, and the second oscillation circuit of the first oscillation circuit unit and the second oscillation circuit of the second oscillation circuit unit output the second oscillated signal with the same period.

28. The measurement apparatus according to claim 27, further comprising a reference signal generating section that generates the reference signal to have a period substantially equal to a period of the signal under measurement, and supplies the generated reference signal to each of the second oscillation circuits.

* * * * *